(12) United States Patent
Seki et al.

(10) Patent No.: US 6,810,919 B2
(45) Date of Patent: Nov. 2, 2004

(54) MANUFACTURING METHOD FOR DISPLAY DEVICE, DISPLAY DEVICE, MANUFACTURING METHOD FOR ELECTRONIC APPARATUS, AND ELECTRONIC APPARATUS

(75) Inventors: Shunichi Seki, Fujimi-cho (JP); Hideyuki Kimura, Fujimi-cho (JP); Naoki Yamamoto, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/327,894

(22) Filed: Dec. 26, 2002

(65) Prior Publication Data

US 2003/0140982 A1 Jul. 31, 2003

(30) Foreign Application Priority Data

Jan. 11, 2002 (JP) .......................... 2002-004940

(51) Int. Cl.[7] ................................. B65B 1/04
(52) U.S. Cl. ...................... 141/1; 349/149; 438/29; 438/166
(58) Field of Search .................... 141/1, 11, 4, 5, 141/7, 48, 65, 82, 67; 438/166, 149, 308, 29, 30, 34, 613; 349/149, 150, 155, 153, 182, 188, 189–192

(56) References Cited

U.S. PATENT DOCUMENTS 6,451,636 B1 * 9/2002 Segawa et al. ............. 438/166
6,619,334 B2 * 9/2003 Fallon et al. ................. 141/11
6,667,188 B2 * 12/2003 Tanabe ......................... 438/48
2002/0041302 A1   4/2002 Okada et al.

FOREIGN PATENT DOCUMENTS

| EP | 0 989 778 A1 | 3/2000 |
| EP | 1 004 977 A2 | 5/2000 |
| JP | A 2000-89019 | 3/2000 |
| JP | A 2000-218890 | 8/2000 |
| JP | A 2000-353594 | 12/2000 |
| JP | A 2001-76881 | 3/2001 |
| JP | A 2001-341296 | 12/2001 |
| WO | WO99/48339 | 9/1999 |

* cited by examiner

*Primary Examiner*—Steven O. Douglas
(74) *Attorney, Agent, or Firm*—Oliff & Berridge, PLC

(57) ABSTRACT

A bank section (112a, 112b) are formed between a plurality of electrodes (111) which are formed on the base body (2). A functional layer is formed on each electrode (111) by injecting a composition from a plurality of nozzles. A display device is manufactured which is provided bank sections (112a, 112b) between the functional layers formed on the electrode (111). A nozzle array in which a plurality of nozzles are disposed to be inclined in a main scanning direction scans on the base body (2). A liquid drop (110c1) of the composition which is injected initially for each functional layer is injected so as to contact at least a part of the bank sections (112a, 112b).

According to manufacturing method for a display device in the present invention, it is possible to realize a display device having superior display quality without causing non-uniform functional layer for each pixel electrode.

30 Claims, 20 Drawing Sheets

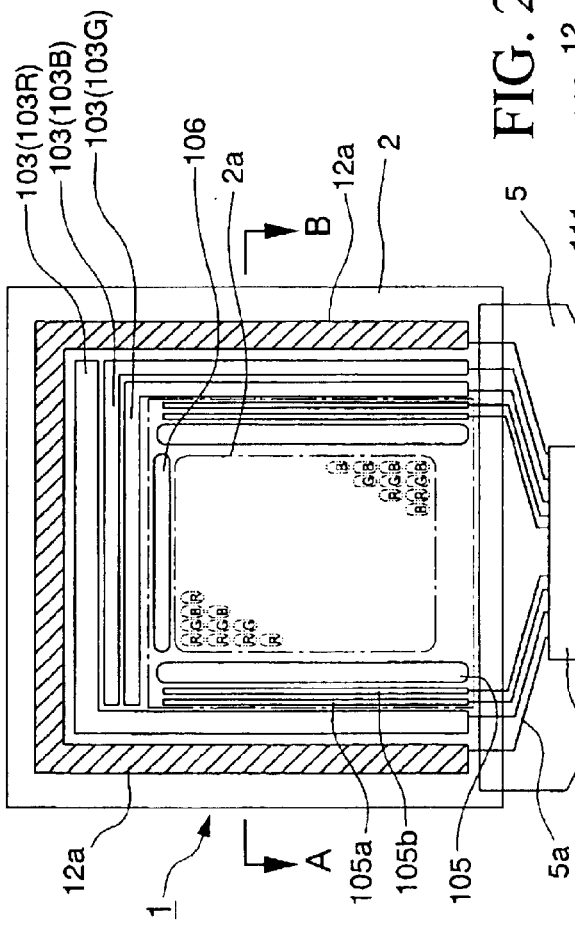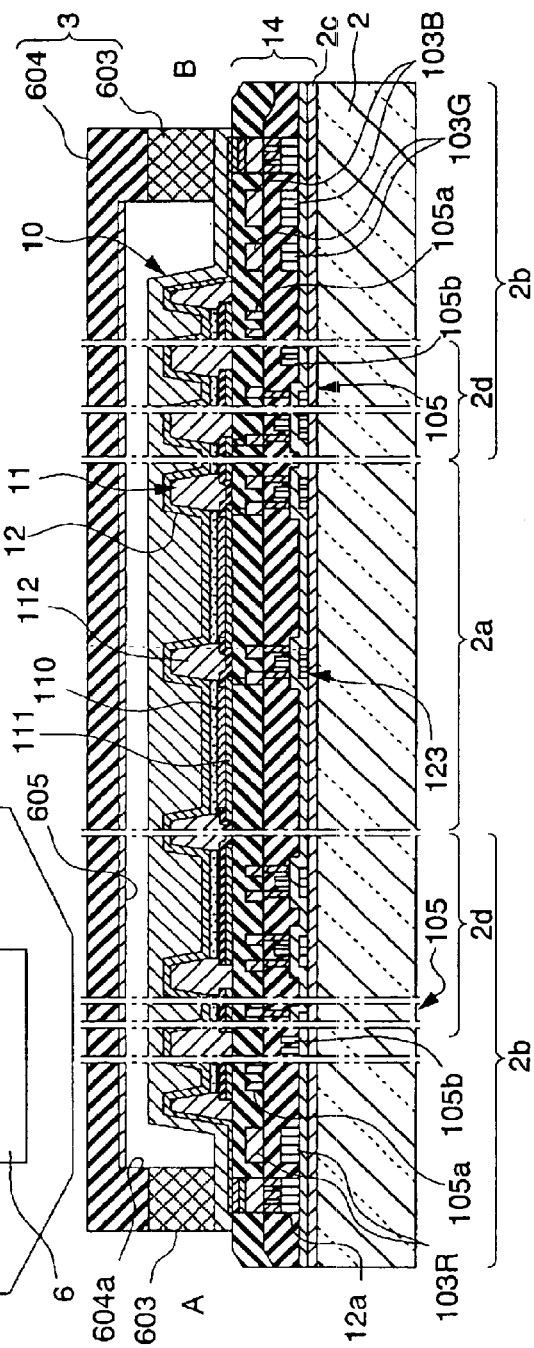

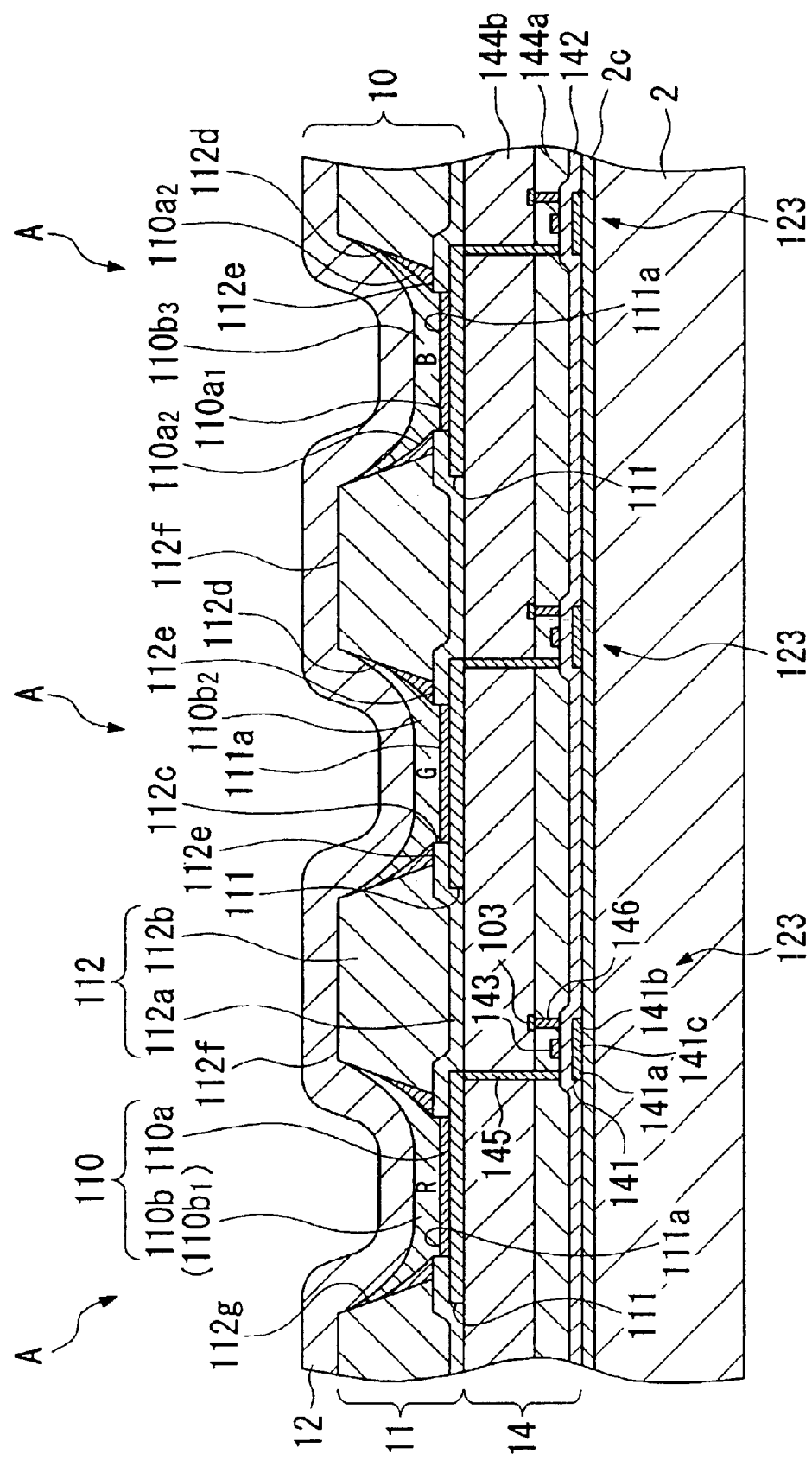

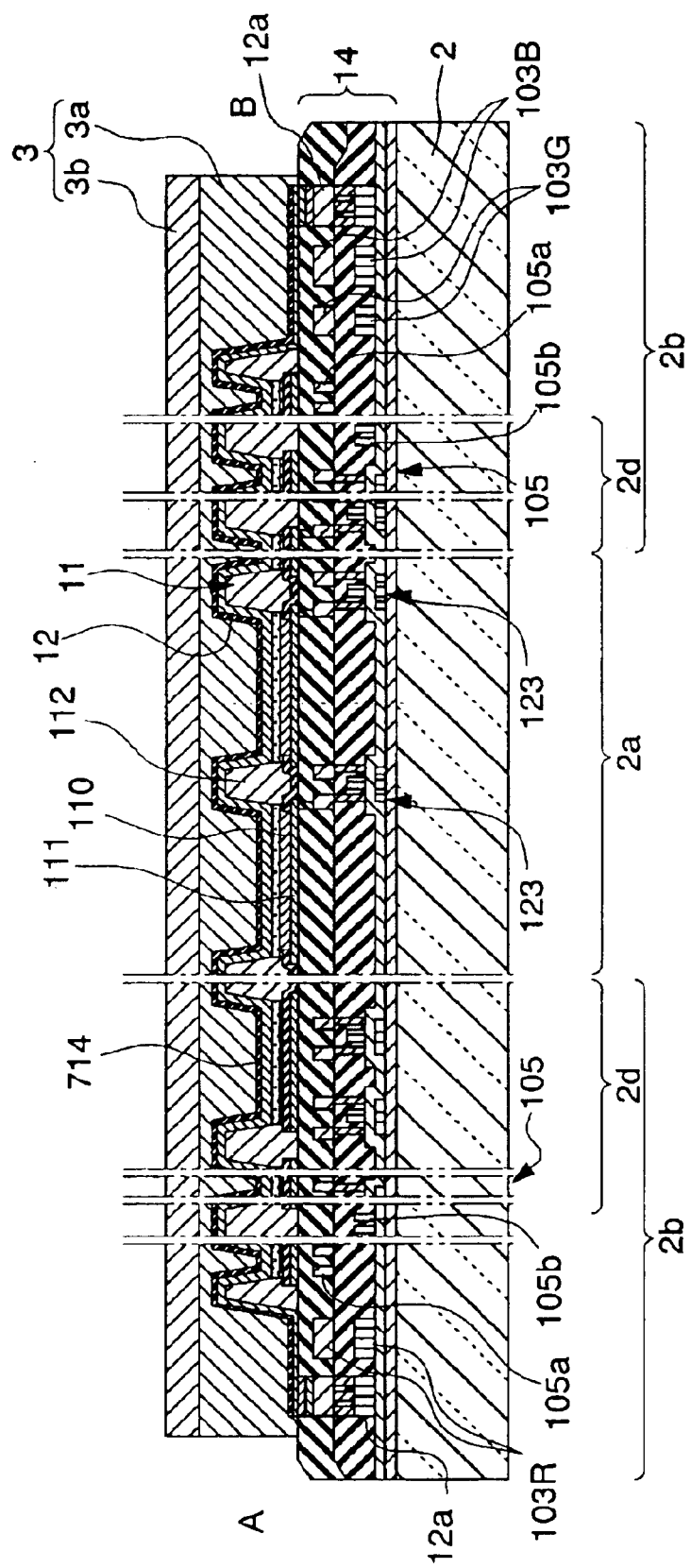

STRIPE

MOSAIC

DELTA

MANUFACTURING METHOD FOR DISPLAY DEVICE, DISPLAY DEVICE, MANUFACTURING METHOD FOR ELECTRONIC APPARATUS, AND ELECTRONIC APPARATUS

TECHNICAL FIELD

The present invention relates to manufacturing method for a display device, a display device, manufacturing method for an electronic apparatus, and an electronic apparatus.

BACKGROUND ART

In recent years, a color display device in which a functional layer made from a functional member is sandwiched between a pair of electrodes and, in particular, an organic electro-luminescence (hereinafter called EL) display device using a functional member such as an organic illuminating member are developed by employing a patterning method for the functional member in an ink jet method in which the functional member such as organic fluorescence member is liquefied so as to be injected on a base member.

In the patterning method for the functional member explained above, a bank section is formed around a pixel electrode made from, for example, ITO formed on a base body, and next, the pixel electrode and a part of the bank section neighboring the pixel electrode are processed lyophilically and the rest of the bank section is processed to be made volatile, consequently, a composition which includes members contained in the functional layer is injected in approximately center of the pixel electrode so as to be dried; thus, the functional layer is formed on the pixel electrode.

In such a conventional method, if the injected composition overflows from the bank section, it does not occur that the injected composition is repelled at a region in the bank section which is processed to be water-repellant and flows on the other neighboring pixel electrodes; thus, it is possible to performing a patterning operation accurately.

However, in the conventional method, the composition which is injected spreads from a center of the pixel electrode toward a periphery therearound uniformly; thus, the injected composition hardly spreads to a part of the bank section which is processed to be lyophilic. Therefore, there is a case in which the uniformity in the functional layers cannot be realized among the pixel electrodes. It is considered that the reason for this is because a part of the bank section which is processed to be lyophilic is a very small area around the pixel electrode; therefore, the composition does not spread due to factors such as surface tension.

DISCLOSURE OF INVENTION

The present invention was made in consideration for the above situation. An object of the present invention is to provide a display device and manufacturing method therefore which can realize a superior display quality without causing non-uniformity in the functional layer per each pixel electrode.

In order to achieve the above object, the present invention employs the following structures.

The manufacturing method for a display device according to the present invention is characterized in that the manufacturing method for a display device has a bank section between functional layers formed on electrodes by forming a bank section around a plurality of electrodes formed on a base body and forms the functional layers on each of the electrodes by injecting a composition from a plurality of nozzles, a nozzle arrays where a plurality of the nozzles are disposed scan on the base body in a diagonal manner in a main scanning direction, and liquid drops of the compositions which are initially injected for each functional layer are injected so as to contact at least a part of the bank section.

According to such a manufacturing method for a display device, the liquid drops of the composition which are initially injected for each functional layer contact at at least a part of the bank section and the liquid drops are transported from the bank section to a surface of the electrode; therefore, it is possible that the liquid drop of the composition is preferentially applied around the electrode uniformly. Thus, it is possible to form the functional layer in approximately uniform thickness.

Also, the manufacturing method for a display device according to the present invention is characterized in that a region which is processed to be lyophilic and a region which is processed to be water-repellant are formed in the bank section, and the liquid drop of the composition contacts the water-repellant region.

By such manufacturing method for the display device, the liquid drops of the composition contacts a region of the bank section which is processed to be lyophilic; thus, it is possible that the liquid drops can be transported from the bank section to a surface of the electrode quickly; thus, it is possible to preferentially spread the liquid drops of the composition around the electrode quickly.

Also, the manufacturing method for a display device according to the present invention is characterized in that the bank section is formed by a first bank layer which is processed to be lyophilic and a second bank layer which is processed to be water-repellant, and the first bank layer is formed so as to overlap a part of the electrode.

According to such manufacturing method for a display device, the first bank layer which is processed to be lyophilic is formed to overlap a part of the electrode; the composition spreads on the first bank layer sooner than on the electrode. Thus, it is possible to apply the composition uniformly.

Next, the manufacturing method for a display device according to the present invention in which functional layers are formed on each of a plurality of electrodes formed on a base body and bank sections are provided between the functional layers is characterized in comprising steps of bank section forming step for forming the bank sections so as to overlap a part of the electrode, lyophilizing step for processing at least a part of the electrodes to be lyophilic, water-repelling step for processing a part of the bank sections to be water-repellant, functional layer forming step for forming at least a functional layer on each of the electrode by injecting the compositions from a plurality of the nozzles, and facing electrodes forming step for forming facing electrodes on the functional layer. In the functional layer forming step, while nozzle arrays where a plurality of the nozzles are disposed scan on the base body in a diagonal manner in a main scanning direction, the liquid drops of the compositions which are initially injected for each functional layer are injected so as to contact at least a part of the bank section.

According to such manufacturing method for a display device, the liquid drops of the composition which are initially injected for each functional layer contact at at least a part of the bank section; thus, the liquid drops are transported from the bank section to a surface of the electrodes. Therefore, it is possible to preferentially apply the liquid drops of the compositions around the electrode uniformly. Therefore, it is possible to form the functional layer in a uniform thickness.

Also, the manufacturing method for a display device according to the present invention is characterized in that the bank section is formed by a first bank layer which is processed to be lyophilic in the lyophilizing step and a second bank layer which is processed to be water-repellant in the water-repellant step, and the first bank layer is formed so as to overlap a part of the electrode.

According to such manufacturing method for a display device, the first bank layer which is processed to be lyophilic is formed to overlap a part of the electrode; therefore, the composition spreads on the first bank layer sooner than on the electrode. Therefore, it is possible to apply the composition uniformly.

Also, the manufacturing method for a display device according to the present invention is characterized in that the functional layer includes at least a positive hole implantation/transportation layer.

Also, the manufacturing method for a display device according to the present invention is characterized in that the functional layer includes at least an illuminating layer.

According to such manufacturing method for a display device, the functional layer includes a positive hole implantation/transportation layer or an illuminating layer; therefore, it is possible to form the positive hole implantation/transportation layer or the illuminating layer in an approximately uniform thickness.

Also, in the above functional layer forming step, each of the functional layer may be formed by injecting liquid drops of the composition by plural times, and an interval for dropping the liquid drops may be smaller than a diameter of the liquid drop. In such a case, scanning operation by the above nozzle arrays for each functional layer may occur once.

Also, in the functional layer forming step, each of the functional layers may be formed by injecting liquid drops of the composition plural times, and an interval for dropping the liquid drops may preferably be larger than a diameter of the liquid drop. In such a case, scanning operation by the above nozzle arrays to each functional layer may be once or more than twice. In the case in which the scanning operation is performed plural times, it is preferable that different nozzles be used for each scanning operation for each functional layer by the nozzle arrays.

Here, for such method using different nozzles, it is possible for the nozzle arrays to be shifted in a sub-scanning direction per scanning operation for each functional layer by the nozzle arrays.

According to such a manufacturing method for a display device, different nozzles in the nozzle arrays can be used for each scanning operation. By doing this, it is possible to reduce unevenness in the injection amount of the composition for each nozzle; thus, it is possible to reduce unevenness in the thickness of the functional layers. By doing this, it is possible to manufacture a display device having superior display quality.

Next, the display device according to the present invention is characterized in being manufactured according to the manufacturing method for a display device according to any one of the aspects of the present invention.

Such a display device is manufactured according to the manufacturing method for the above display device; therefore, it is possible to reduce unevenness in the thickness of the functional layer and form the functional layer uniformly. Therefore, it is possible to improve the display quality by the display device.

Next, the manufacturing method for a display device according to the present invention is characterized in having a bank section between functional layers formed on electrodes by forming a bank section around a plurality of electrodes formed on a base body and forming the functional layers on each of the electrodes by injecting a composition from a plurality of nozzles and an electronic apparatus having a driving circuit for driving the display device. Nozzle arrays where a plurality of the nozzles are disposed scan on the base body in a diagonal manner in a main scanning direction, and liquid drops of the compositions which are initially injected for each functional layer are injected so as to contact at least a part of the bank section.

According to the manufacturing method for an electronic apparatus, the liquid drops which are initially injected for each functional layer contact at least a part of the bank section. By doing this, the liquid drops are transported from the bank section to a surface of the electrode; thus, it is possible to preferentially apply the liquid drops of the composition around the electrode uniformly. Therefore, it is possible to form the functional layer in approximately uniform thickness.

Also, the manufacturing method for an electronic apparatus according to the present invention is characterized in that a region which is processed to be lyophilic and a region which is processed to be water-repellant are formed in the bank section, and the liquid drop of the composition contacts the water-repellant region.

According to such a manufacturing method for an electronic apparatus, the liquid drops of the composition contact the region of the bank section which is processed to be water-repellant. Therefore, it is possible for the liquid drops to be transported from the bank section to a surface of the electrode quickly. Also, it is possible to preferentially spread the liquid drops of the composition around the electrode quickly.

Also, the manufacturing method for an electronic apparatus according to the present invention is characterized in that the bank section is formed by a first bank layer which is processed to be lyophilic and a second bank layer which is processed to be water-repellant, and the first bank layer is formed so as to overlap a part of the electrode.

According to such a manufacturing method for an electronic apparatus, the first bank section which is processed to be lyophilic is formed to overlap a part of the electrode; thus, the composition spreads on the first bank layer sooner than on the electrode. Thus, it is possible to apply the composition uniformly.

Also, the manufacturing method for a display device in which functional layers are formed on each of a plurality of electrodes formed on a base body and bank sections are provided between the functional layers and an electronic apparatus having a driving circuit for driving the display device is characterized in comprising steps of a bank section forming step for forming the bank sections so as to overlap a part of the electrode, lyophilizing step for processing at least a part of the electrodes to be lyophilic, water-repelling step for processing a part of the bank sections to be water-repellant, functional layer forming step for forming at least a functional layer on each of the electrode by injecting the compositions from a plurality of the nozzles, and facing electrodes forming step for forming facing electrodes on the functional layer. In the functional layer forming step, while nozzle arrays where a plurality of the nozzles are disposed scan on the base body in a diagonal manner in a main scanning direction, the liquid drops of the compositions which are initially injected for each functional layer are injected so as to contact at least a part of the bank section.

According to such a manufacturing method for an electronic apparatus, the liquid drops of the composition which are initially injected for each functional layer contact at least a part of the bank section. By doing this, the liquid drops are transported from the bank section to a surface of the electrode. Therefore, it is possible to preferentially apply the liquid drops of the composition around the electrode uniformly; thus, it is possible to form the functional layer in approximately uniform thickness.

Also, the manufacturing method for an electronic apparatus according to the present invention is characterized in that the bank section is formed by a first bank layer which is processed to be lyophilic in the lyophilizing step and a second bank layer which is processed to be water-repellant in the water-repellant step, and the first bank layer is formed so as to overlap a part of the electrode.

According to such a manufacturing method for an electronic apparatus, the first bank layer which is processed to be lyophilic is formed to overlap a part of the electrode. Therefore, the composition spreads on the first bank layer sooner than on the electrode; thus, it is possible to apply the composition uniformly.

Also, the manufacturing method for an electronic apparatus according to the present invention is characterized in that the functional layer includes at least a positive hole implantation/transportation layer.

Also, the manufacturing method for an electronic apparatus according to the present invention is characterized in that the functional layer includes at least an illuminating layer.

According to such a manufacturing method for an electronic apparatus, the functional layer includes a positive hole implantation/transportation layer or an illuminating layer. Therefore, it is possible to form the positive hole implantation/transportation layer or the illuminating layer in approximately uniform thickness.

Also, in the functional layer forming step, each of the functional layer may be formed by injecting liquid drops of the composition plural times, and an interval for dropping the liquid drops may be smaller than a diameter of the liquid drop. In such a case, scanning operation by nozzle arrays for each of the functional layer may be performed once.

Also, in the functional layer forming step, each of the functional layer may be formed by injecting liquid drops of the composition by plural times, and an interval for dropping the liquid drops may preferably be larger than a diameter of the liquid drop. In such a case, scanning operation by nozzle arrays for each of the functional layer may be performed once or twice or more. Furthermore, if the scanning operation is performed plural times, a different nozzle may preferably be used for each scanning operation by the nozzle arrays for each functional layer.

Here, for such methods using different nozzles, it is possible for the nozzle arrays to be shifted in a sub-scanning direction per scanning operation for each functional layer by the nozzle arrays.

According to such manufacturing method for a display device, different nozzles in the nozzle arrays can be used for each scanning operation. By doing this, it is possible to reduce unevenness in the injection amount of the composition for each nozzle; thus, it is possible to reduce unevenness in the thickness of the functional layers. By doing this, it is possible to manufacture an electronic apparatus having superior display quality.

Next, an electronic apparatus according to the present invention is characterized to be manufactured according to the manufacturing method for the electronic apparatus which is previously described in any one of aspects of the present invention.

According to such an electronic apparatus, it is possible to reduce unevenness in the thickness of each functional layer and form a functional layer uniformly. Therefore, it is possible to improve display quality in the electronic apparatus.

BRIEF DESCRIPTION OF DRAWINGS

FIGS. 2A and 2B show a display device according to the first embodiment of the present invention. FIG. 2A is a plan view, and FIG. 2B is a cross section viewed in a line AB shown in FIG. 2A.

FIG. 3 shows an important section in a display device according to the first embodiment of the present invention.

FIG. 14A is a perspective view and FIG. 14B is a cross section along a line J—J shown in FIG. 14A.

FIG. 17A is a cross section showing a condition in that an initial liquid drop is injected. FIG. 17B is a cross section for showing other example of condition in that the liquid drops are injected after the initial liquid drop is injected. FIG. 17C is a cross section showing another example of conditions in which the liquid drops later than in a second time are injected.

FIG. 27 is a cross section of a display device according to another embodiment of the present invention.

FIG. 28A shows stripe disposition. FIG. 28B shows mosaic disposition. FIG. 28C shows delta disposition.

BEST MODE FOR CARRYING OUT THE INVENTION

First Embodiment

A display device and manufacturing method therefor according to a first embodiment in the present invention are explained as follows with reference to the drawings. Before explaining manufacturing method for a display device according to the present embodiment, a display device which is manufactured according to the manufacturing method of the present invention is explained.

Figure 1:
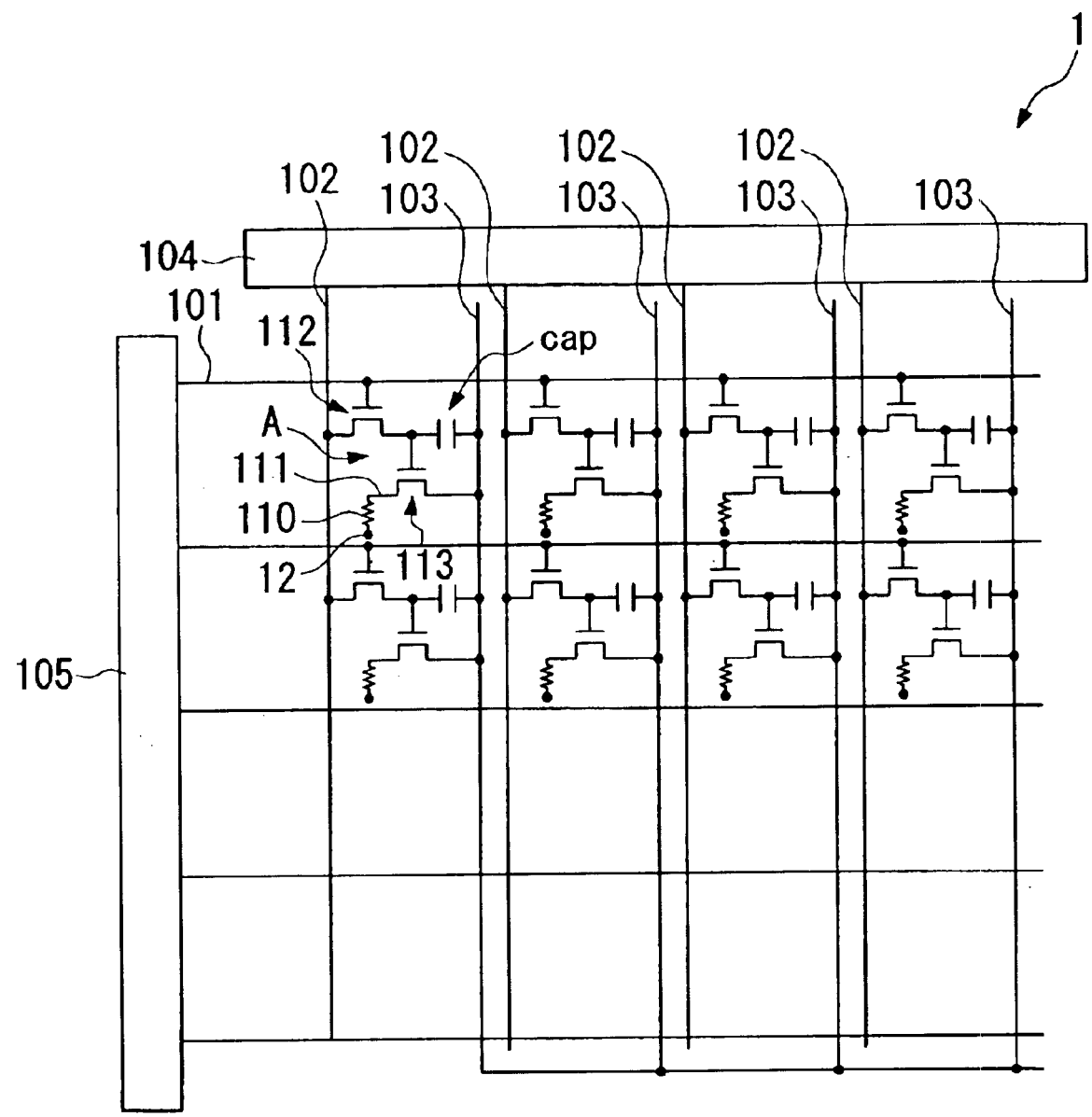
FIG. 1 is a plan view for wiring structure of a display device according to a first embodiment of the present invention.

In FIG. 1, a plan view is shown to explaining wiring structure in a display device according to the present embodiment. In FIGS. 2A and 2B, a plan view and a cross section are shown to explain a display device of the present invention.

As shown in FIG. 1, in a display device 1 according to the present invention, a plurality of scanning lines 101, a plurality of signal lines 102 which extend in a crossing direction to the scanning lines 101, and a plurality of power supply lines 103 which extend in parallel with the signal lines 102 are disposed. Also, a pixel area A is disposed at each cross point of the scanning line 101 and the signal line 102. A data driving circuit 104 which is provided with a shift register, a level shifter, a video line, and an analogue switch is connected to the signal line 102. A scan driving circuit 105 which is provided with a shift register and a level shifter is connected to the scanning line 101.

Furthermore, a switching thin film transistor 112 supplying the scanning signal to a gate electrode via the scanning line 101, a retaining capacity cap for retaining a pixel signal which is supplied from the signal line 102 via the switching thin film transistor 112, and a driving thin film transistor 123 for supplying the pixel signal which is retained in the retaining capacity cap to the gate electrode, a pixel electrode (electrode) 111 to which a driving current flows in from the power supply line 103 when the pixel electrode 111 is connected to a power supply line 103 via the driving thin film transistor 123 electrically, and a functional layer 110 which is sandwiched between the pixel electrode 111 and a cathode (facing electrode) 12 are provided in each pixel area A. An illuminating element is made by the electrode 111, a facing electrode 12, and the functional layer 110.

By such a structure, when the scanning line 101 is driven and the switching thin film transistor 112 is turned on, temporary electrical potential in the signal line 102 is retained in the retaining capacity cap. On/off condition of the driving thin film transistor 123 is determined according to the condition of the retaining capacity cap. The electric current flows from the power supply line 103 to the pixel electrode 111 via a channel of the driving thin film transistor 123, and furthermore, the electric current flows in the cathode 12 via the functional layer 110. The functional layer 110 illuminates according to the amount of electric current flowing therein.

Next, as shown in FIGS. 2A and 2B, a display device 1 according to the present embodiment is provided with a transparent base body 2 made of glasses, an illuminating element which is disposed in a matrix, and a sealing base board. The illuminating element which is formed on the base body 2 is formed by a pixel electrode which is explained later, a functional layer, and a cathode 12.

The base body 2 is, for example, a transparent glass base board and is divided in a display area 2a which is disposed in a center of the base body 2 and a no-display area which is disposed outside of the display area around a periphery of the base body 2.

The display area 2a is formed by an illuminating element which is disposed in a matrix as an effective display area. A no-display area 2b is formed outside the display area. A dummy display 2d neighboring the display area 2a is formed in the no-display area 2b.

Also, as shown in FIG. 2B, a circuit element section 14 is provided between the illuminating element section 11 which is formed by the illuminating element and the bank section and the base body 2. The circuit element section 14 is provided with the scanning line, the signal line, the retaining capacity, the switching thin film transistor, and the driving thin film transistor 123 which are explained previously.

Also, an end of the cathode 12 is connected to a cathode wiring 12a which is formed on the base body 2, and an end section 12b is connected to a siring 5a on a flexible base board 5. Also, the wiring 5a is connected to a driving IC (driving circuit) 6 which is provided on the flexible base board 5.

Also, as shown in FIGS. 2A and 2B, the power supply line 103 (103R, 103G, 103B) is disposed in the no-display area 2b in the circuit element 14.

The scanning driving circuit 105, 105 are disposed on both ends in the display area 2a shown in FIG. 2A. The scanning driving circuits 105 and 105 are provided in the circuit element section 14 beneath a dummy area 2d. Furthermore, a circuit driving control signal wiring 105a which is connected to the scanning driving circuits 105 and 105, and a driving circuit power supply line 105b are provided in the circuit element section 14.

Furthermore, an inspection circuit 106 is disposed on an upper area of the display area 2a shown in FIG. 2A. It is possible to inspect quality of the display device during a manufacturing process therefor and as a final product without defect.

Also, as shown in FIG. 2B, a sealing section 3 is provided on the illuminating element 11. The sealing section 3 is formed by a sealing resin 603a which is applied on the base body 2 and a can sealing base board 604. The sealing resin 603 is a thermally curable resin or an ultraviolet ray curable resin. In particular, the sealing resin 603 should preferably be formed by an epoxy resin which is a type of the thermally curable resin.

The sealing resin 603 is applied around the base body 2 in circular disposition by using, for example, a microdispenser. The sealing resin 603 attaches the base body 2 to a sealing can 604. The sealing resin 604 prevents water or oxygen from entering from between the base body 2 and the can sealing base board 604 to the inside of the can sealing base board 604. The sealing resin 604 also prevents the illuminating layer, not shown in the drawing, which is formed in the cathode 12 or the illuminating element section 11 from being oxidized.

The can sealing base board 604 is a glass or a metal. The can sealing base board 604 is attached to the base body via the sealing resin 603. A concave section 604a for containing the display element 10 is formed inside of the can sealing base body 604. A getter agent which absorbs a water and an oxygen 605 is bonded on the concave section 604a so as to absorb the water or the oxygen which enter in the can sealing base body 604. Here, it is acceptable that the getter agent 605 is omitted.

Next, FIG. 3 is an enlarged view of cross section of the display area in the display device. In FIG. 3, three pixel areas A are shown. On the base board 2 of the display device 1, the circuit element section 14 on which circuits such as TFT are formed and the illuminating element section 11 on which the functional layer 110 is formed are layered alternately.

In the display device 1, a light which is emitted from the functional layer 110 toward the base body 2 is transported through the circuit element section 14 and the base body 2 so as to be emitted beneath the base body 2 (toward an observer). Also, the light which is emitted from the functional layer 110 opposite to the base body 2 is reflected by the cathode 12 an transported through the circuit element section 14 and the base body 2 so as to be transported beneath the base body 2 (toward an observer).

Here, if a transparent cathode 12 is used, it is possible to emit a light which illuminates from the cathode. For such a transparent member, ITO, Pt, Ir, Ni, or Pd can be used. 75 nm thickness is preferable. More preferably, thinner thickness is preferred.

A base protecting layer 2c made from a silicon oxide layer is formed on the base board 2 in the circuit element section 14. An island semiconductor layer 141 made from a polysilicon is formed on the base protection layer 2c. Here, a source area 141a and a drain area 141b are formed on the semiconductor layer 141 by high-density P-ion implanting. Here, an area where P is not introduced is a channel area 141c.

Furthermore, a transparent gate insulating layer 142 which covers the base protection layer 2c and the semiconductor layer 141 is formed in the circuit element section 14. A gate electrode 143 (scanning line 101) made from a metal such as Al, Mo, Ta, Ti, and W is formed on the base insulating layer 142. A transparent first inter-layer insulating layer 144a an a second inter-layer insulating layer 144b are formed on the gate electrode 143 and the gate insulating layer 142. The gate electrode 143 is disposed in a position which corresponds to a channel area 141c in the semiconductor layer 141.

Also, contact holes 145 and 146 through the first and second inter-layer insulating layer 114a and 144b so as to be connected to the source area in the semiconductor layer 141 and the drain area of the semiconductor layer 141 respectively are formed.

A transparent pixel electrode 111 made of an ITO, etc., is formed on the second inter-layer insulating layer 144b in a predetermined shape by a patterning operation. One of the of the contact hole 145 is connected to the pixel electrode 111.

Also, the contact hole 146 is connected to the power supply line 103.

By doing this, a driving thin film transistor 123 which is connected to each pixel electrode 111 is formed in the circuit element section 14.

Here, although the retaining capacity cap and the switching thin film transistor 112 is formed which are explained previously are formed in the circuit element section 14, these are not shown in FIG. 3.

Next, as shown in FIG. 3, the illuminating element section 11 is formed mainly by the functional layer 110 which is layered on a plurality of pixel electrode 111, a bank section 112 which is disposed between each of the pixel electrode and the functional layer 110 so as to separate each of the functional layer 110, and the cathode 12 (second electrode) which is formed on the functional layer 110. The illuminating element is formed by the pixel element (first element) 111, the functional layer 110, and the cathode (second electrode).

Here, the pixel electrode 111 is formed by, for example, a metal such as ITO. The pixel electrode 111 is formed in approximately rectangular in plan view by a patterning operation. Thickness of the pixel electrode 111 should preferably be in a range of 50 to 200 nm, in particular, nearly 150 nm is more preferable. A bank section 112 is disposed between each of the pixel electrodes 111a and 111.

As shown in FIG. 3, bank section 112 is formed by an inorganic bank layer 112a (first bank layer) which is disposed near the base body 2 and an organic bank layer 112b (second bank layer) which is disposed farther from the base body 2 thereon.

The inorganic bank layer and the organic bank layer (112a and 112b) are formed so as to overlap a periphery of the pixel electrode 111. In a plan view, the periphery of the pixel electrode 111 and the inorganic bank layer 112a are overlapping. Also, the organic bank layer 112b has the same structure; thus, the bank layer 112 overrides a part of the pixel electrode 111. Also, the inorganic bank layer 112a is formed in more center of the pixel electrode 111 than the organic bank layer 112b. By doing this, each of first layer section 112e in the inorganic bank layer 112a is formed inside of the pixel electrode 111. By doing this, a lower opening section 112c is disposed so as to correspond to a position of the pixel electrode 111.

Also, an upper opening section 112d is formed in the organic bank layer 112b. The upper opening section 112d is disposed so as to correspond to positions of the pixel electrode 111 and the lower opening section 112c. As shown in FIG. 3, the upper opening section 112d is formed so as to be larger than the lower opening section 112c and narrower than the pixel electrode 111. Also, there is a case in which the position of an upper part of the upper opening section 112d and an end of the pixel electrode 111 are approximately the same. In such a case, as shown in FIG. 3, cross section of the upper opening section 112d in the organic bank layer 112b is diagonal.

In addition, an opening section 112 which penetrates through the inorganic bank layer 112a and the organic bank layer 112b is formed in the bank section 112 by communicating through the lower opening section 112c and the upper opening section 112d.

Also, it is preferable that the inorganic bank layer 112a be an inorganic member such as $SiO_2$, or $TiO_2$. Thickness of the inorganic bank layer 112a should preferably be in a range of 50 to 200 nm, more particularly, 150 nm. If the thickness is less than 50 nm, the thickness of the inorganic bank layer 112a is thinner than a positive hole implantation/transportation layer which is to be explained; thus, it is not preferable because it is impossible to realize flatness of the positive hole implantation/transportation layer. Also, if the inorganic bank layer 112a is thicker than 200 nm, a gap made by the lower opening section 112c becomes larger; thus, it is impossible to realize flatness of an illuminating layer which is layered on the positive hole implantation/transportation layer to be explained later. Thus, it is not preferable.

Furthermore, the organic bank layer 112b is made from a heat-resistive and solution-resistive resist such as acryl resin, and polyimide resin. It is preferable that the thickness of the organic bank layer 112b be in a range of 0.1 to 3.5 $\mu$m, in particular, nearly 2 $\mu$m. If the thickness is less than 0.1 $\mu$m, the organic bank layer 12b becomes thinner than the total thickness of the positive hole implantation/transportation layer which is to be explained and the illuminating layer; thus, it is not preferable because there is a concern that the illuminating layer spills over the upper opening section 112d. Also, if the thickness is larger than 3.5 $\mu$m, a gap made by the upper opening section 112d becomes larger; thus, it is not preferable because it does not yield a step coverage by the cathode 12 which is formed on the organic bank layer 112b. Also, if the organic bank layer 112b is thicker than 2 $\mu$m, it is possible because it is possible to enhance insulation to the driving thin film transistor 123.

Also, an area which indicates lyophilic characteristics and an area which indicates water-repellant characteristics are formed in the bank section 112.

The area which indicates lyophilic characteristics are the first layered section 112e in the inorganic bank layer 112a and a surface 111a of the pixel electrode 111. Surfaces of these areas are processed to be lyophilic by performing plasma processing operation using a processing gas such as oxygen. The area which exhibits water-repellant characteristics are the wall surface of the upper opening section 112d and an upper surface 112f of the organic bank layer 112. Surfaces of these areas are processed by a plasma processing operation by using a processing gas such as tetrafluoromethane (water-repellant).

Next, as shown in FIG. 3, the functional layer 110 is formed by a positive hole implantation/transportation layer 110a which is layered on the pixel electrode 111 and an illuminating layer 110b which is formed next to the positive hole implantation/transportation layer 110a. Here, it is acceptable that other functional layer having function such as an electron implantation transportation layer is further formed next to the illuminating layer 110b.

The positive hole implantation/transportation layer 110a has a function for implant a positive hole in to the illuminating layer 110b and for transport the positive hole in the positive hole implantation/transportation layer 110a. By disposing such positive hole implantation/transportation layer 110a between the pixel electrode 111 and the illuminating layer 110b, superior characteristics in the illuminating layer 110b such as illuminating efficiency and the product life can be obtained. Also, the positive hole which is implanted from the positive hole implantation/transportation layer 110a and an electron which is implanted from the cathode 12 are united again in the illuminating layer 110b; thus, illuminating function can be realized.

The positive hole implantation/transportation layer 110a is formed by a flat section 110a1 which is formed in the lower opening section 112c on the pixel electrode surface 111a and a peripheral section 110a2 which is formed in the upper opening section 112d on the first layer section 112e of the inorganic bank layer. Also, the positive hole implantation/transportation layer 110a is formed only between the inorganic bank layers 110a (lower opening section 110c) on the pixel electrode 111; thus, such a disposition may depend on its structure, and it is acceptable for the positive hole implantation/transportation layer 110a to be formed only on the flat section).

Thickness of the flat section 110a1 is constant, for example, within a range of 50 to 70 nm.

When the periphery section 110a2 is formed, the periphery section 110a2 is disposed on the first layer section 112e and contacts a wall surface of the upper opening section 112d, such as the organic bank layer 112b closely. Also, the thickness of the periphery section 110a2 is thin near the surface 111a of the electrode and increases in a direction away from the surface 111a of the electrode. The thickness of the periphery section 11a2 is the thickest near the wall surface of the lower opening section 112d.

The periphery section 110a2 has various shapes because the positive hole implantation/transportation layer 110a is formed by injecting a first composition including a positive hole implantation/transportation layer forming member and polar solution in the opening section 112 and removing the polar solution, the polar solution evaporates mainly on the first layer section 112e on the inorganic bank layer; thus, the positive hole implantation/transportation layer forming member is condensed and extracted collectively on the first layer section 112e.

Also, the illuminating layer 10b is formed on the flat section 110a1 of the positive hole implantation/transportation layer 110a and the periphery section 110a2. The thickness of the illuminating layer 110b is in a range of 50 to 80 nm on the flat section 112a1.

The illuminating layer 110b has three colors such as a red illuminating layer 110b1 for illuminating in red (R), a green illuminating layer 110b2 for illuminating in green (G), and a blue illuminating layer 110b3 for illuminating in blue (B). Illuminating layer 110b1 to 110b3 are disposed in a stripe.

As explained above, the periphery section 110a2 of the positive hole implantation/transportation layer 110a contacts the wall surface (organic bank layer 112b) of the upper opening section 112d closely; therefore, the illuminating layer 110bdoes not contact the organic bank layer 112b directly. Therefore, it is possible to prevent water which is contained as an impurity in the organic bank layer 112b from being migrating to the illuminating layer 110b by using the periphery section 112a2; thus, it is possible to prevent the illuminating layer 110b from being oxidized.

Also, the periphery section 110a2 having non-uniform thickness is formed on the first layer section 112e in the inorganic bank layer. Thus, the periphery section 110a2 is insulated from the pixel electrode 111 by the first layer section 112e. Therefore, the positive hole is not implanted from the periphery section 110a2 into the illuminating layer 110b. By doing this, electric current flows from the pixel electrode 111 only the flat section 112a1; thus, it is possible to transport the positive hole from the flat section 112a1 to the illuminating layer 110b uniformly. Therefore, it is possible to illuminate only a central area of the illuminating layer 110b and equalize the illumination amount in the illuminating layer 110b.

Also, the inorganic bank layer 112a extends in more inwardly of the pixel electrode 111 by the inorganic bank layer 112b. Thus, it is possible to trim shape of the connecting part of the pixel electrode 111 and the flat section 110a1 by the inorganic bank layer 112a; therefore, it is possible to reduce non-uniformity of illumination intensity between the illuminating layers 110b.

Furthermore, the surface 111a of the pixel electrode 111 and the first layer section 112e of the inorganic bank layer indicate the lyophilic characteristics; therefore, the functional layer 110 closely contacts the pixel electrode 111 and the inorganic bank layer 112a uniformly. Thus, the functional layer 110 does not become extremely thin on the inorganic bank layer 112a; therefore, it is possible to prevent a short-circuit from occurring between the pixel electrode 111 and the cathode 12.

Also, an upper surface 112f of the organic bank layer 112b and the wall surface of the upper opening section 112d indicate water-repellant characteristics; therefore, contact between the functional layer 110 and the organic bank layer 112b is reduced; thus, there is not a case in which the functional layer 110 is formed such that the functional layer 110 spills over the opening section 112g.

For a member for forming a positive hole implantation/transportation layer, for example, a mixture of polythiophene derivative such as polyethylene dioxythiophene and polystyrene sulfonic acid can be used. For a member for forming the illuminating layer 110b, polyfluorene derivative such as compositions 1 to 5, or (poly-)p-phenylene vinylene derivative, polyphenylene derivative, polyfluorene derivative, polyvinyl carbazole, polythiophene derivative can be used. Also, above polymer member can be used by doping a member such as perylene dye, coumarin dye, rhodamine dye, rubrene, perylene, 9,10-diphenylanthracene, tetraphenylbutadiene, Nile-red, coumarin 6, quinacridone.

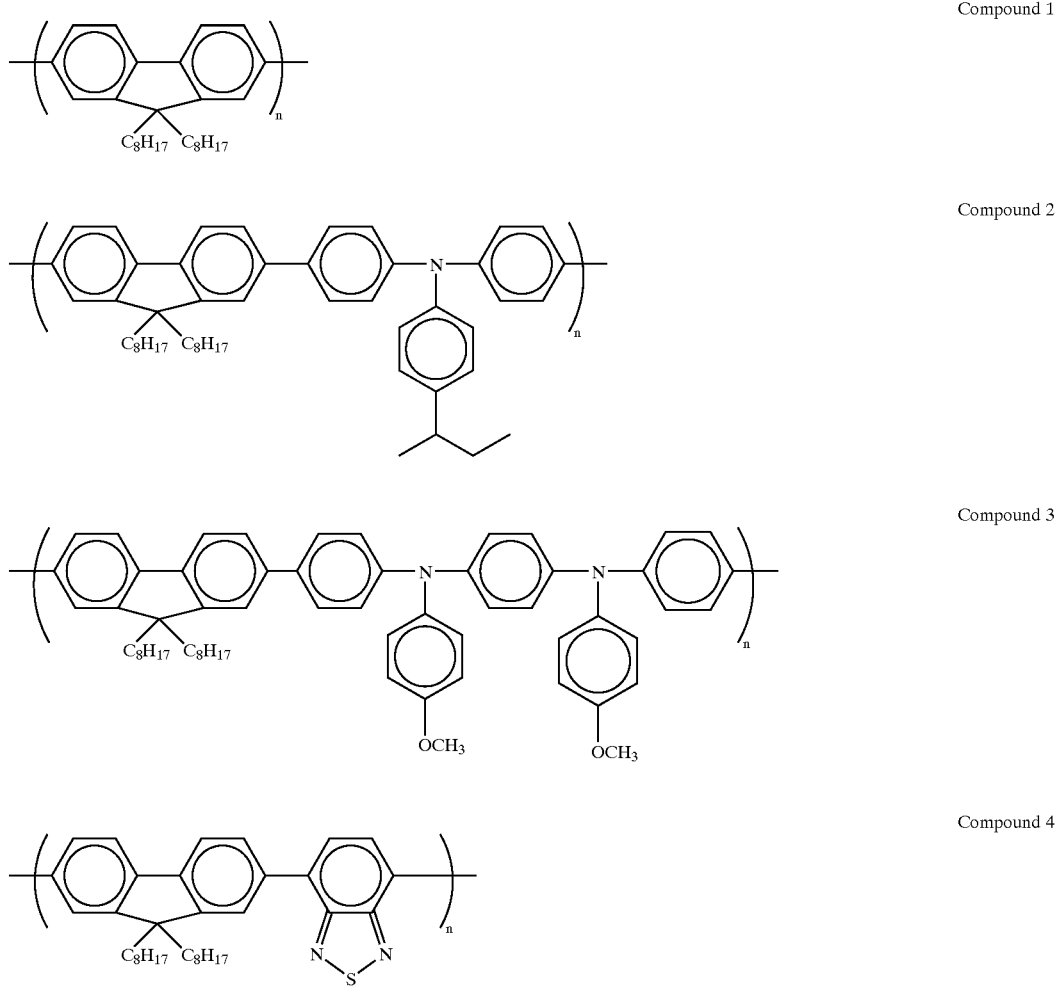

Compound 1

Compound 2

Compound 3

Compound 4

-continued

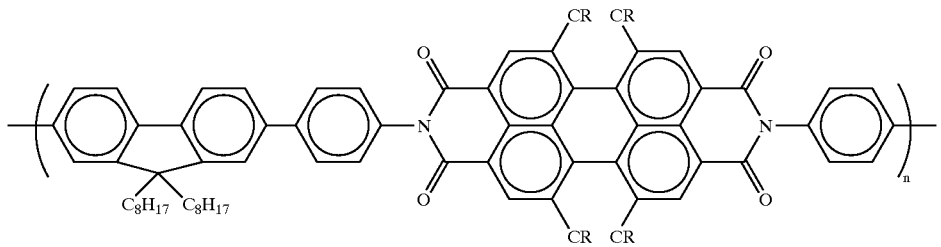

Compound 5

Next, a cathode 12 is formed on an entire surface of the illuminating element 11. The cathode 12 is coupled with the pixel electrode 111 so as to flow electric current to the functional layer 110. The cathode 12 can be formed by layering a calcium layer and an aluminum layer. In such a case, it is preferable to dispose the calcium layer or the aluminum layer having low work function on the cathode which is disposed near the illuminating layer. In particular, in the present embodiment, the cathode 12 works for implanting an electron into the illuminating layer 110b by contacting the illuminating layer 110b directly. Also, in a lithium fluoride, a LiF can be formed between the illuminating layer 110 and the cathode 12 so as to illuminate efficiently.

Here, the red illuminating layer 10b1 and the red illuminating layer 110b2 are not limited to a lithium fluoride; thus, it is acceptable to use another member. Therefore, in such a case, a layer made of the lithium fluoride is formed only in the blue (B) illuminating layer 110b3 and other members are layered in the red illuminating layer 110b1 and the green illuminating layer 110b2. Also, it is acceptable that only the calcium be formed on the red illuminating layer 110b1 and the green illuminating layer 110b2 instead of the lithium fluoride.

Here, thickness of the lithium fluoride is preferably in a range of 2 to 5 nm, in particular, near 2 nm. Also, the thickness of the calcium is preferably in a range of 2 to 50 nm, in particular, near 20 nm.

Also, the aluminum which forms the cathode 12 reflects the light which is emitted from the illuminating layer 110b toward a base body 2; therefore, the aluminum for forming the cathode 12 should preferably be made of an Al layer, Ag layer, and a layered structure of Al and Ag. Also, the thickness should preferably be in a range between 100 to 1000 nm, in particular, near 200 nm.

Furthermore, it is acceptable that a protection layer made of metal such as SiO, $SiO_2$, SiN be disposed on the aluminum for preventing the oxidization.

Here, a sealing can 604 is disposed on the illuminating element which is formed in this way. As shown in FIG. 2B, the sealing can 604 is bonded by a sealing resin 603; thus, a display device 1 is formed.

Next, manufacturing method for a display device according to the present embodiment is explained with reference to the drawings.

Manufacturing method for the display device 1 according to the present embodiment comprises processes of (1) bank section forming process, (2) plasma processing (including an lyophilic process and a water-repellant process), (3) positive hole implantation/transportation forming process (functional layer forming process), (4) illuminating layer forming process (functional layer forming process), (5) facing electrode forming process, and (6) sealing process. Here, manufacturing processes in the present embodiment is not limited to the above method. It is acceptable that other process be omitted or added according to necessity.

(1) Bank Forming Process

In a bank forming process, a bank section 112 is formed on a predetermined position on the base body. The bank section 112 is formed by an inorganic bank layer 112a as a first bank layer and an organic bank layer 112b as a second bank layer.

Forming method is explained as follows.

(1)-1 Forming Inorganic Bank Layer

Figure 4:
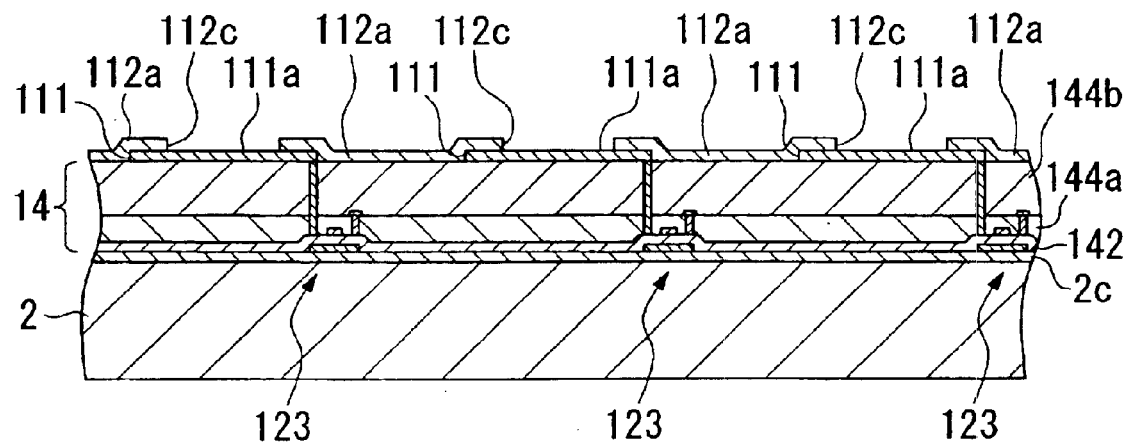
FIG. 4 is a cross section for showing manufacturing method for a display device according to the first embodiment of the present invention.

First, as shown in FIG. 4, an inorganic bank layer 112a is formed in a predetermined position on the base body. The inorganic bank layer 112 is formed on a second inter-layer insulating layer 114b and an electrode (pixel electrode here) 111. Here, the second inter-layer insulating layer 144b is formed on a circuit element section 14 on which a thin film transistor, a scanning line, and a signal line are formed.

For an inorganic bank layer 112a, for an example, inorganic layer such as $SiO_2$ or $TiO_2$ can be used. These members can be formed by CVD method, Coating method, Sputtering method, or vacuum deposition method.

Furthermore, thickness of the inorganic bank layer 112a is preferable to be in a range of 50 to 200 nm, in particular, 150 nm.

The inorganic bank layer 112 having an opening section is formed by forming an inorganic layer on the inter-layer insulating layer 114 and an entire surface of the pixel electrode 111 and performing patterning operation to the inorganic layer by a photolithograph method or the like. The opening section corresponds to a position where the surface 111a of the pixel electrode 111. As shown in FIG. 4, the opening section is disposed as a lower opening section 112c.

In this case, the inorganic bank layer 112a is formed so as to overlap a periphery section (a part) of the pixel electrode 111. As shown in FIG. 4, by forming the inorganic bank layer 112a such that the inorganic bank layer 112a overlaps a part of the pixel electrode 111, it is possible to control an illuminating area in the illuminating layer 110.

(1)-2 Forming Organic Bank Layer 112b

Next, an organic bank layer 112b is formed as a second bank layer.

Figure 5:
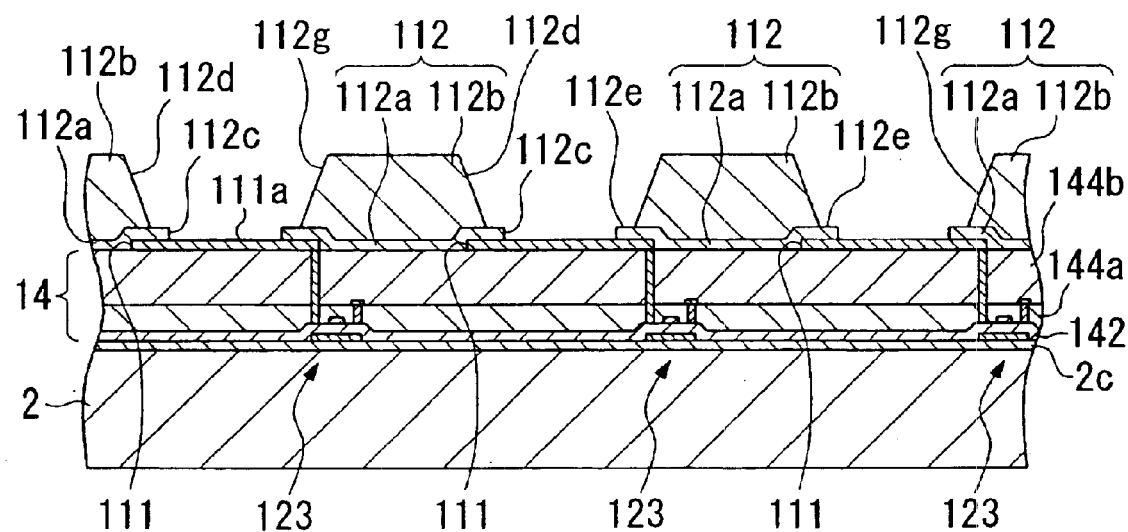
FIG. 5 is a cross section for showing manufacturing method for a display device according to the first embodiment of the present invention.

As shown in FIG. 5, an organic bank layer 112b is formed on an inorganic bank layer 112a. For an organic bank layer 112b, a member having heat-resistance and solution-resistance such as an acrylic resin, or a polyimide resin is used the organic bank layer 112b is formed by performing patterning operation by using these members. Here, in the patterning operation, an upper opening section 112d is formed in the organic bank layer 112b. The upper opening section 112d is disposed corresponding to the surface 111a of the pixel electrode and the lower opening section 112c.

It is preferable that the upper opening section 112 is formed to be larger than the lower opening section 112c which is formed in the inorganic bank layer 112a as shown in FIG. 5. Furthermore, it is preferable that the shape of the organic bank layer 112b be tapered. It is preferable that an opening section of the organic bank layer be narrower than a width of the pixel electrode 111. Also, it is preferable that the width of the opening section of the organic bank layer be approximately the same as that of the pixel electrode 111 on an uppermost surface of the organic bank layer 112b. By doing this, the first layer section 112e which surrounds the lower opening section 112c on the inorganic bank layer 112a expands more centerally in the pixel electrode 111 than the organic bank layer 112b.

By communicating the upper opening section 112d which is formed on the organic bank layer 112b and the lower opening section 112c which is formed in the inorganic bank layer 112a in this way, an opening section 112g which communicates through the inorganic bank layer 112a and the organic bank layer 112b is formed.

Here, the thickness of the organic bank layer 112b is preferably in a range of 0.1 to 3.5 μm, in particular, near 2 μm. The reason why such a range is preferable is as follows.

That is, if the thickness is smaller than 0.1 μm, the thickness of the organic bank layer 112b is smaller than a total thickness of the positive hole implantation/transportation layer and it may occur that the illuminating layer 110b spills over the upper opening section 112d; thus, it is not preferable. If the thickness exceeds 3.5 μm, a gap made by the upper opening section 112d becomes larger and it is not possible to obtain a step coverage by the cathode 12 in the upper opening section 112d; thus, it is not preferable. If the thickness of the organic bank layer 112b is larger than 2 μm, it is possible to enhance the insulation between the cathode 12 and the driving thin film transistor 123; thus, it is preferable.

(2) Plasma Processing Operation

Next, a plasma processing operation is performed for purposes of activating a surface of the pixel electrode 111 and performing a surface processing for the bank section 112. In particular, purposes in the activating operation are to clean the pixel electrode 111 (ITO) and adjusting operating functions. Furthermore, the activating operation performs a lyophilic operation (lyophilic process) on a surface of the pixel electrode 111 and a water-repellant operation (water-repellant process) on a surface of the bank section 112.

The plasma processing operation can be categorized, for example, into (2)-1 a preliminary heating process, (2)-2 an activating process (lyophhilic process), (2)-3 a water-repellant process (lyophilic process), and (2)-4 a cooling process. Here, the plasma processing operation is not limited to these categories and process therein can be omitted or added according to necessity.

Figure 6:
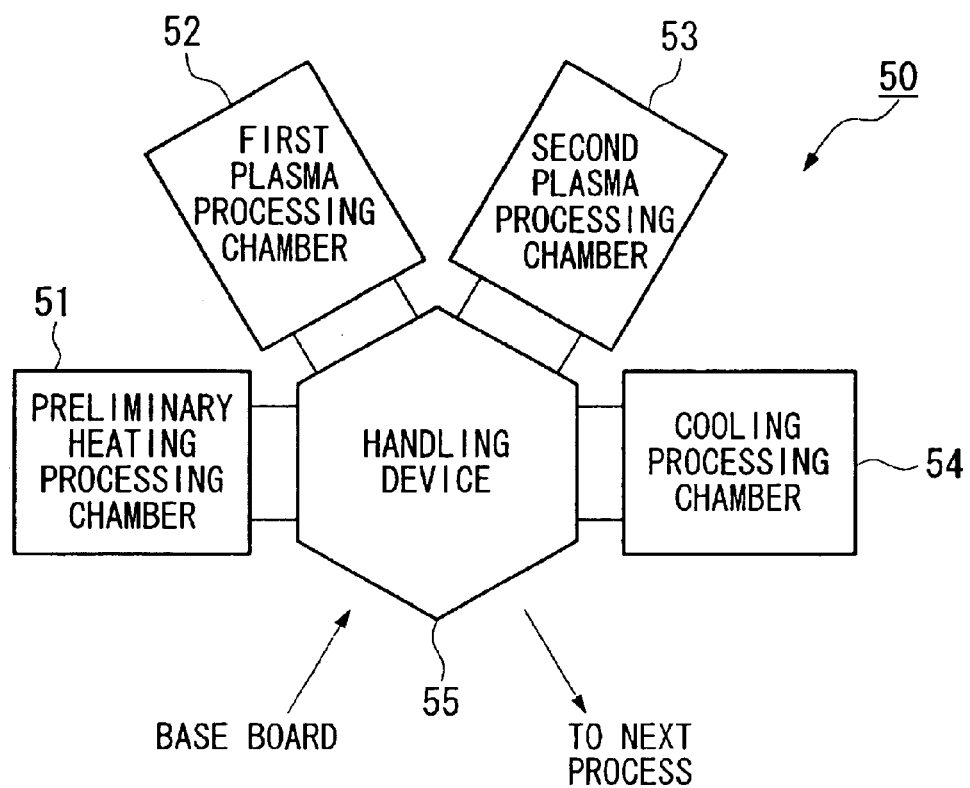
FIG. 6 is a plan view of a plasma-processing device which is used for manufacturing a display device according to a first embodiment of the present invention.

First, FIG. 6 shows a plasma processing device which is used for performing a plasma processing operation. A plasma processing device 50 shown in FIG. 6 is formed by a preliminary heating chamber 51, a first plasma processing chamber 52, a second plasma processing chamber 53, a cooling processing chamber 54, and a handling device for handling a base body 2 to these chambers 51 to 54. These chambers 51 to 54 are disposed in a radial manner around the handling device 55.

The general process is explained by using these devices.

A preliminary heating process is performed in the preliminary heating processing chamber 51 shown in FIG. 6. A base body 2 which is handled from the bank section forming process is heated at a predetermined temperature in the preliminary heating processing chamber 51.

A lyophilic process and a water-repellant process are performed after the preliminary heating process. That is, the base body is transported to a first plasma processing chamber 52 and the second plasma processing chamber 53 subsequently. The plasma processing operation is performed to the bank section 112 in each chamber so as to be lyophilic. A water-repellant process is performed after the lyophilic processing. The base body is transported to a cooling processing chamber after the water-repellant process and the base body is cooled down to room temperature in the cooling processing chamber 54. The base body is transported to a next process so as to perform a positive hole implantation/transportation layer forming process by the handling device after the cooling processing operation.

Each process is explained in detail as follows.

(2)-1 Preliminary Heating Process

A preliminary heating process is performed in the preliminary heating processing chamber 51. The base body 2 including the bank section 112b is heated to a predetermined temperature in the preliminary heating processing chamber 51.

The base body 2 is heated by a heater which is attached to a stage for mounting a base body thereon in the preliminary heating processing chamber 51 so as to heat the base body 2 and the stage. For a heating method, other method can be employed.

The base body 2 is heated in a temperature range of, for example, 70° C. to 80° C. in the preliminary heating processing chamber 51. Such a temperature is employed in a next process such as a plasma processing operation. The purpose for employing such a temperature is to heat the base body 2 so as to correspond a conditions in a next process and reduce unevenness in the temperature of the base body 2.

If there is no preliminary heating process, the base body 2 is heated in the above temperature. Under such a condition, the plasma processing operation is performed to the base body 2 from the beginning to the end with a continuous variation of the temperature. There is a possibility that the characteristics in an organic EL element may become uneven when the plasma processing operation is performed while the temperature of the base body changes. Therefore, the preliminary heating process is performed so as to maintain the process conditions constant and realize uniform characteristics.

Here, when the lyophilic process and a water-repellant process are performed under conditions that the base body 2 is mounted on a sample stage in the first plasma processing device 52 and the second plasma processing device 53 in the plasma processing operation, it is preferable that the preliminary heating process temperature should approximately be the same as that of the sample stage 56 in which lyophilic processes and the water-repellant processes are performed.

Here, the preliminary heating process is performed to the base body 2 in a temperature such as 70° C. to 80° C. to which the temperature of the sample stage in the first plasma processing device 52 and the second plasma processing device 53 increase. By doing this, the plasma processing condition is approximately the same between before and after the plasma processing operation even if the plasma processing operation is performed on numeraous base bodies continuously. By doing this, it is possible to maintain the condition for a surface processing of the base body 2; thus, it is possible to equalize the wettability of the bank section 112 against the composition. Therefore, it is possible to manufacture a display device having a constant quality.

Also, by performing a preliminary heating process in advance, it is possible to shorten time for processing in the plasma processing operation which is performed later.

(2)-2 Activating Process (Lyophilic Process)

An activating process is performed in the first plasma processing chamber 52. The activating process includes processes such as adjusting and controlling a work functions in the pixel electrode 111, cleaning a surface of the pixel electrode, and performing a lyophilic process for a surface of the pixel electrode.

Figure 7:
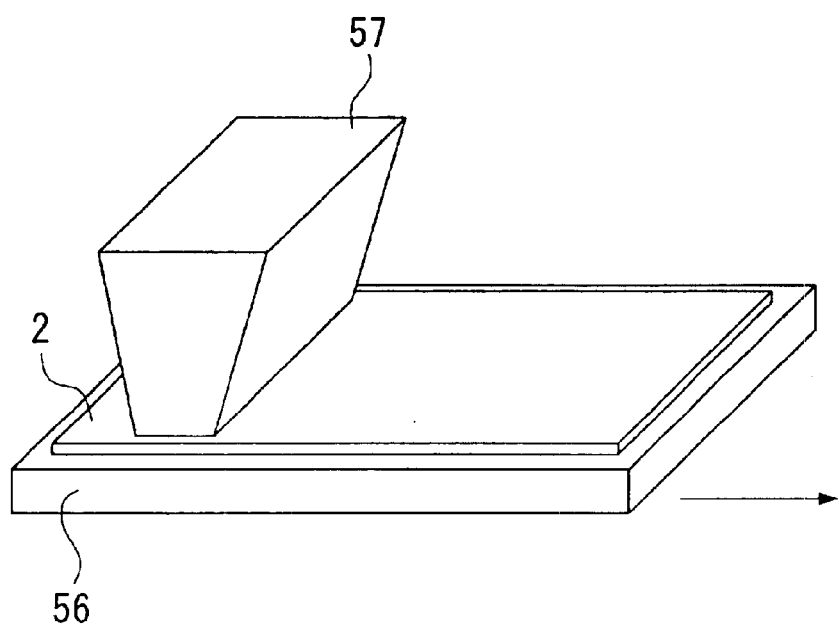
FIG. 7 is a view showing an internal structure of a first plasma processing chamber in a plasma processing device shown in FIG. 6.

In the lyophilic process, a plasma process ($O_2$ plasma process) using oxygen as a process gas in an atmosphere. In FIG. 7, the plasma processing operation is graphically shown. As shown in FIG. 7, the base body 2 including the bank section 112 is mounted on the sample stage 56 having a heater thereinside. A plasma discharging electrode 57 is disposed on an upper surface of the base body 2 so as to face the base body 2 having a gap distance such as 0.5 to 2 mm. The base body 2 is heated by the sample stage 56. Simultaneously, the sample stage 56 is transported in a direction which is indicated in FIG. 7 in a predetermined speed. During that period, oxygen in a plasma-state is emitted to the base body 2.

For $O_2$ plasma processing, conditions such as 100 to 800 kW of plasma power, 50 to 100 ml/min of oxygen gas flow, 0.5 to 10 mm/sec of board transportation speed, 70 to 90° C. of base body temperature are acceptable. The sample stage 56 performs the heating operation so as to mainly maintain the temperature in the base body to which the preliminary heating process is performed.

Figure 8:
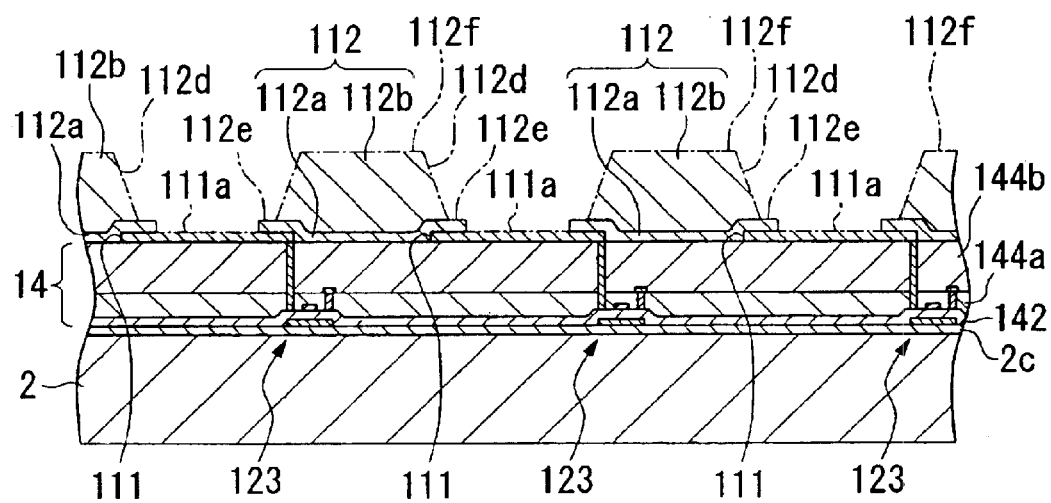
FIG. 8 is a cross section for showing manufacturing method for a display device according to the first embodiment of the present invention.

By the $O_2$ plasma processing, as shown in FIG. 8, lyophilic process is performed to the surface 111a of the pixel electrode 111, the first layer section 112e in the inorganic bank layer 112a, a wall surface of the upper opening section 112d and an upper surface 112f in the organic bank layer 12b. By the lyophlic process, a hydroxyl group is introduced to each surface; thus, lyophilic characteristics is given.

Figure 9:
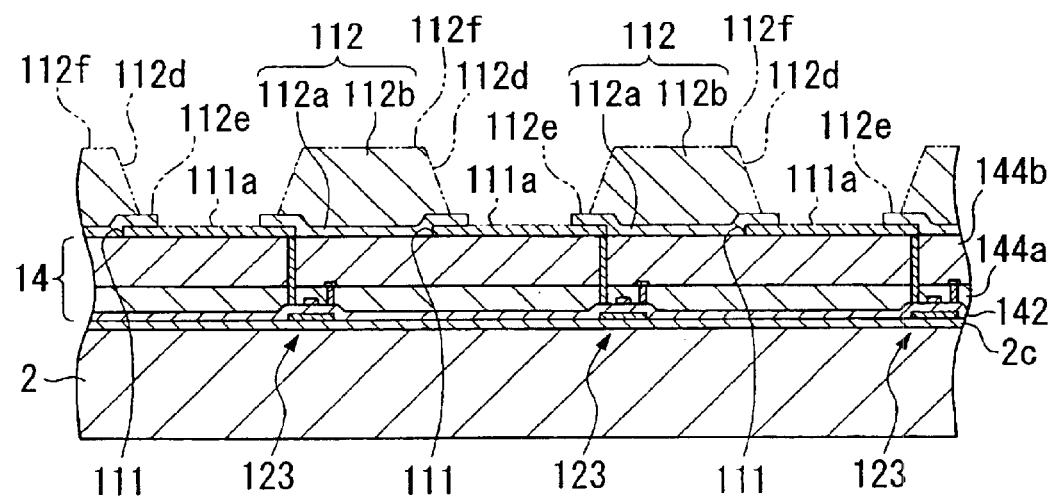
FIG. 9 is a cross section for showing manufacturing method for a display device according to the first embodiment of the present invention.

In FIG. 9, a broken line indicates the area to which the lyophilic process is performed.

Here, the $O_2$ plasma process not only gives lyophilic characteristics but also cleans the pixel electrode such as ITO and adjusts the work functions compatibly.

(2)-3 Water-Repellant Process (Water-Repellant Operation)

Next, a plasma process ($CF_4$ plasma process) as a water-repellant process is performed in the second plasma processing chamber 53 using a process gas such as tetrafluoromethane in an atmosphere. The internal structure of the second plasma processing chamber 53 is the same as that of the first plasma processing chamber 52 shown in FIG. 7. That is, the base body 2 is heated by the sample stage, and during that period, the base body 2 and the sample stage are transported at a predetermined speed. During that period, the tetrafluoromethane in a plasma state is emitted to the base body 2.

$CF_4$ plasma process can be performed under conditions such as 100 to 800 kW of plasma power, 50 to 100 ml/min of fluoromethane gas flow, 0.5 to 10 mm/sec of base body transporting speed, 70° C. to 90° C. of base body temperature. The heating stage heats the base body 2 for a purpose of maintaining the temperature of the base body to which the preliminary heating process is performed similarly to a case of the first plasma processing chamber 52.

Here, a process gas is not limited to a tetrafluoromethane. Other fluorocarbon gas can be used for a process gas.

By performing $CF_4$ plasma process, as shown in FIG. 9, lyophilic process is performed to a wall surface of the upper opening section 112d and an upper surface 112f of the organic bank layer. By the lyophilic process, a fluorine group is introduced to each surface; thus, water-repellant characteristics is given there. In FIG. 9, an area which indicates the water-repellant characteristics is shown by a two-dot broken line. Lyophilic process can be performed easily on organic members such as acrylic resin which forms the organic bank layer 112b and polyimide resin by emitting a fluorocarbon in plasma state. There is a feature in that the fluorine member can be formed more easily on these organic members by performing the $O_2$ plasma process. Such a feature is particularly effective in the present embodiment.

Here, the surface 111a of the pixel electrode 111 and the first layer section 112e of the inorganic bank layer 112a are influenced by the $CF_4$ plasma process. However, the wettability will not be influenced. In FIG. 9, an area which exhibits lyophilic properties is indicated by a one-dot broken line.

(2)-4 Cooling Process

In a cooling process, the base body 2 which is heated in the plasma process is cooled to an operational temperature by using the cooling processing chamber 54. This process is performed so as to cool the base body 2 to an operational temperature employed in an ink jet process (functional layer forming process) which is performed later.

The cooling processing chamber 54 has a plate for disposing the base body 2. In the plate, a water cooling device is built therein so as to cool the base body 2.

Also, by cooling the base body after the plasma process at room temperature of a predetermined temperature (for example, an operational temperature in which the ink jet process is performed), the temperature in the base body 2 becomes constant in the next process such as the positive hole implantation/transportation forming process; thus, it is possible to perform a next process without temperature fluctuation of the base board 2. By arranging the cooling process, it is possible to form a member which is injected from an injecting device according to ink jet method or the like uniformly.

For example, when a first composition including a member for forming a positive hole implantation/transportation is injected, it is possible to inject the first composition in an uniform volume continuously; thus, it is possible to form the positive hole implantation/transportation layer uniformly.

In the above plasma process, the $O_2$ plasma process and the $CF_4$ plasma process are performed to the organic bank layer 112b and the inorganic bank layer 112a both of which are made from different member consequently, it is possible to dispose a lyophilic area and a water-repellant area on the bank section 112 easily.

Here, a plasma process device which is used in the plasma process is not limited to a device shown in FIG. 6. For example, a plasma processing device 60 which is shown in FIG. 10 can be used.

Figure 10:
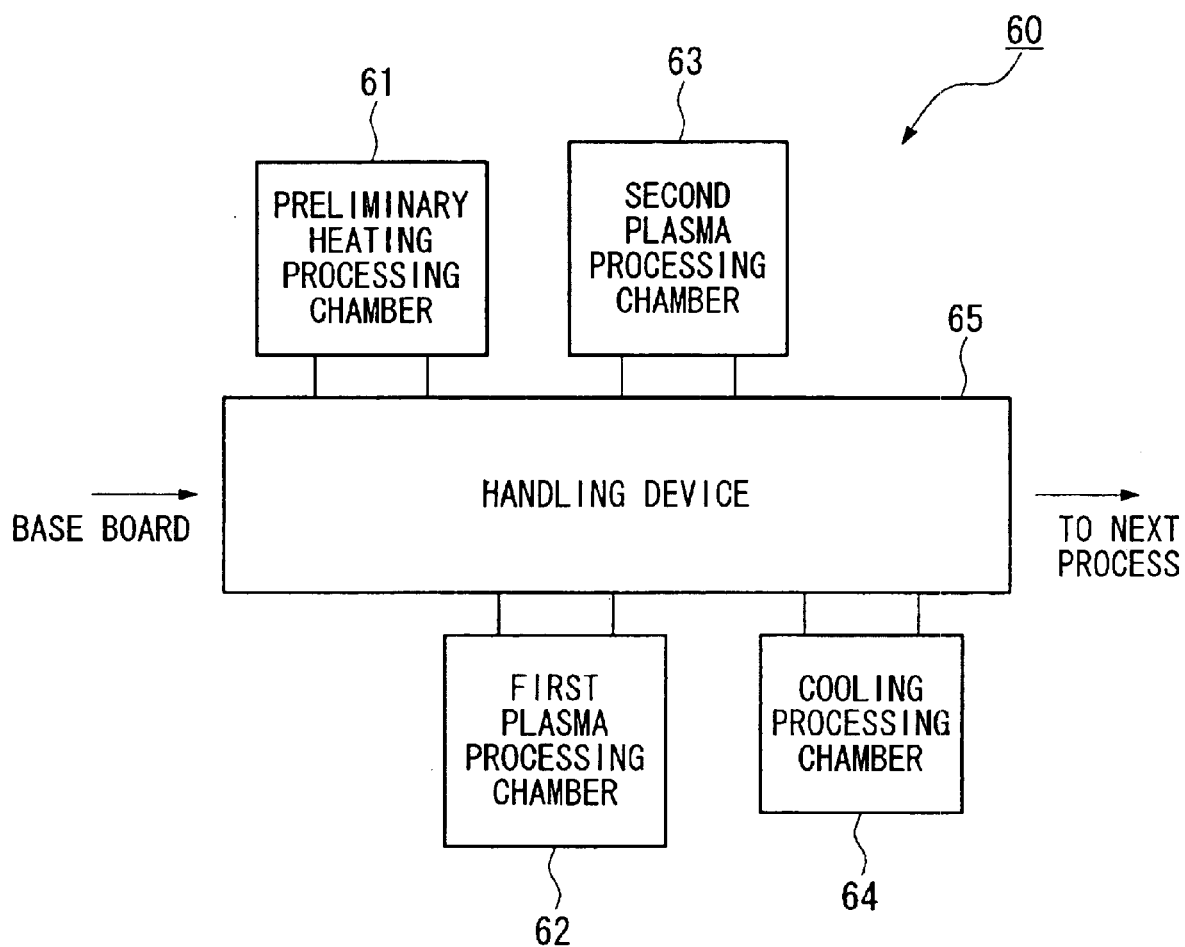
FIG. 10 is a plan view showing other example of the plasma processing device which is used for manufacturing a display device according to the first embodiment of the present invention.

A plasma processing device 60 shown in FIG. 10 is formed by a preliminary heating processing chamber 61, a first plasma processing chamber 62, a second plasma processing chamber 63, a cooling processing chamber 64, and a handling device 65 for transporting the base body 2 to these chambers 61 to 64. These chambers 61 to 64 are disposed on both sides (both sides of an arrow in the drawing) of the handling device 65.

Similarly to a case of the plasma processing device 50 shown in FIG. 6, in the plasma processing device 60, the base body 2 which is transported from the bank section forming process is transported to the preliminary heating processing chamber 61, the first plasma processing chamber 62, the second plasma processing chamber 63, and the cooling processing chamber 64 consequently so as to perform the same processes as the processes explained above.

After that, the base body 2 is transported to next process such as positive hole implantation/transportation layer forming process.

Also, for an above plasma processing device, a device which works under vacuum conditions can be used instead of a device which works under atmospheric pressure conditions.

(3) Positive Hole Implantation/Transportation Layer Forming Process (Functional Layer Forming Process)

Next, a positive hole implantation/transportation layer is formed on an electrode (here, pixel electrode 111) in an illuminating layer forming process.

In the positive hole implantation/transportation layer forming process, a first composition (composition) including a positive hole implantation/transportation layer forming member on the surface 111a of the pixel electrode by using a liquid drop injecting device such as an ink jet device. After that, a dry process and a thermal process are performed so as to form a positive hole implantation/transportation layer 110a on the pixel electrode 111 and the inorganic bank layer 112a. Here, the inorganic bank layer 112a on which the positive hole implantation/transportation layer 110a is formed is called the first layer section 112e.

Processes thereafter including the positive hole implantation/transportation layer forming process should preferably be conducted in an atmosphere without water and oxygen. For example, an atmosphere under a nitrogen atmosphere or argon atmosphere is preferable.

Here, there is a case in which the positive hole implantation/transportation layer 110a is not formed on the first layer section 112e. That is, there is a case in which the positive hole implantation/transportation layer is formed only on the pixel electrode 111.

Manufacturing method according to the ink jet method is as follows.

Figure 11:
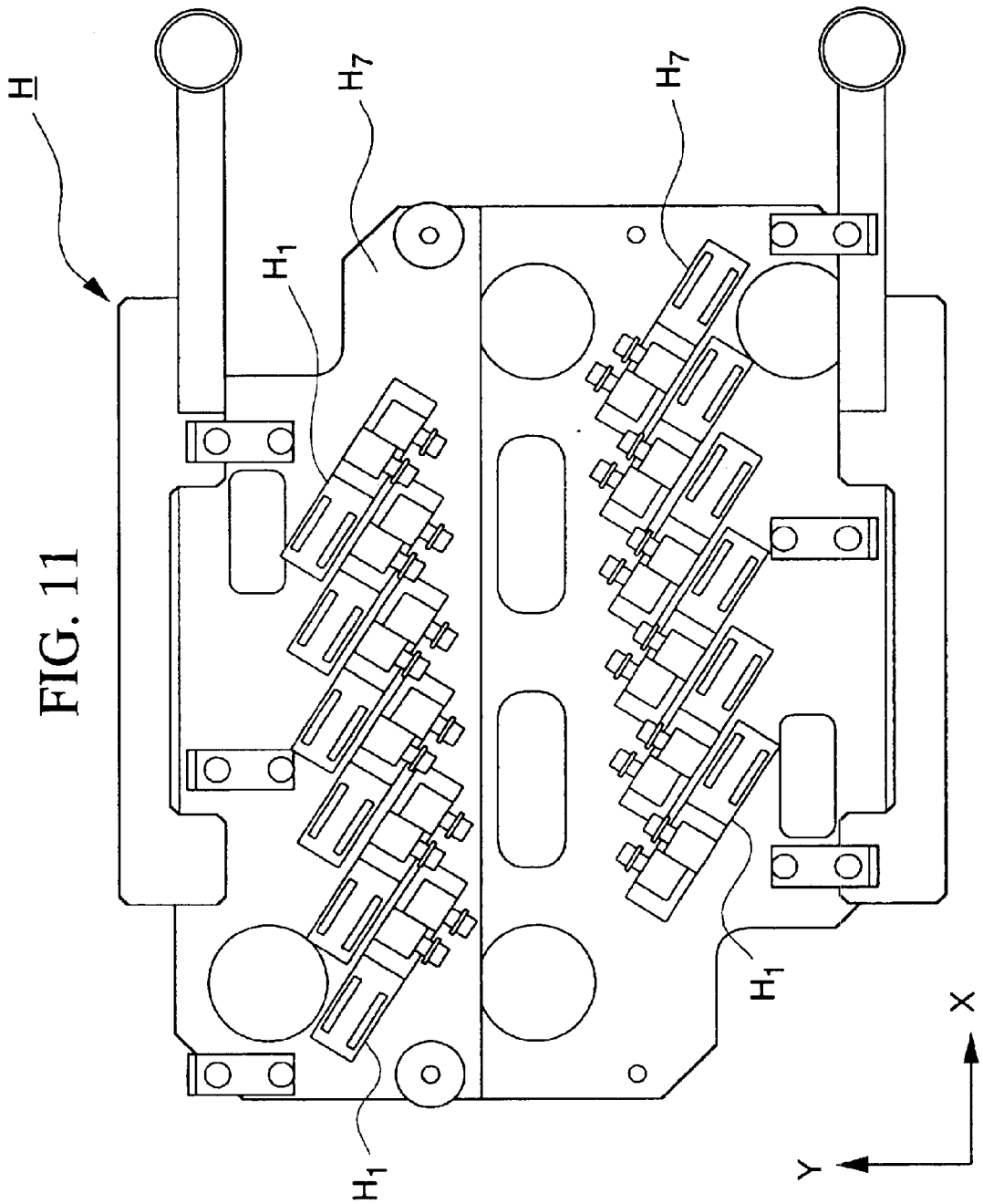
FIG. 11 is a plan view showing a head which used for manufacturing a display device according to the first embodiment of the present invention.

For an example of an ink jet head which is preferably used in a manufacturing method for a display device according to the present embodiment, a head H shown in FIG. 11 can be proposed. As shown in FIG. 11, the head H is formed mainly by a plurality of ink jet heads H1 and a supporting base board H7 for supporting these ink jet heads H1.

Figure 12:
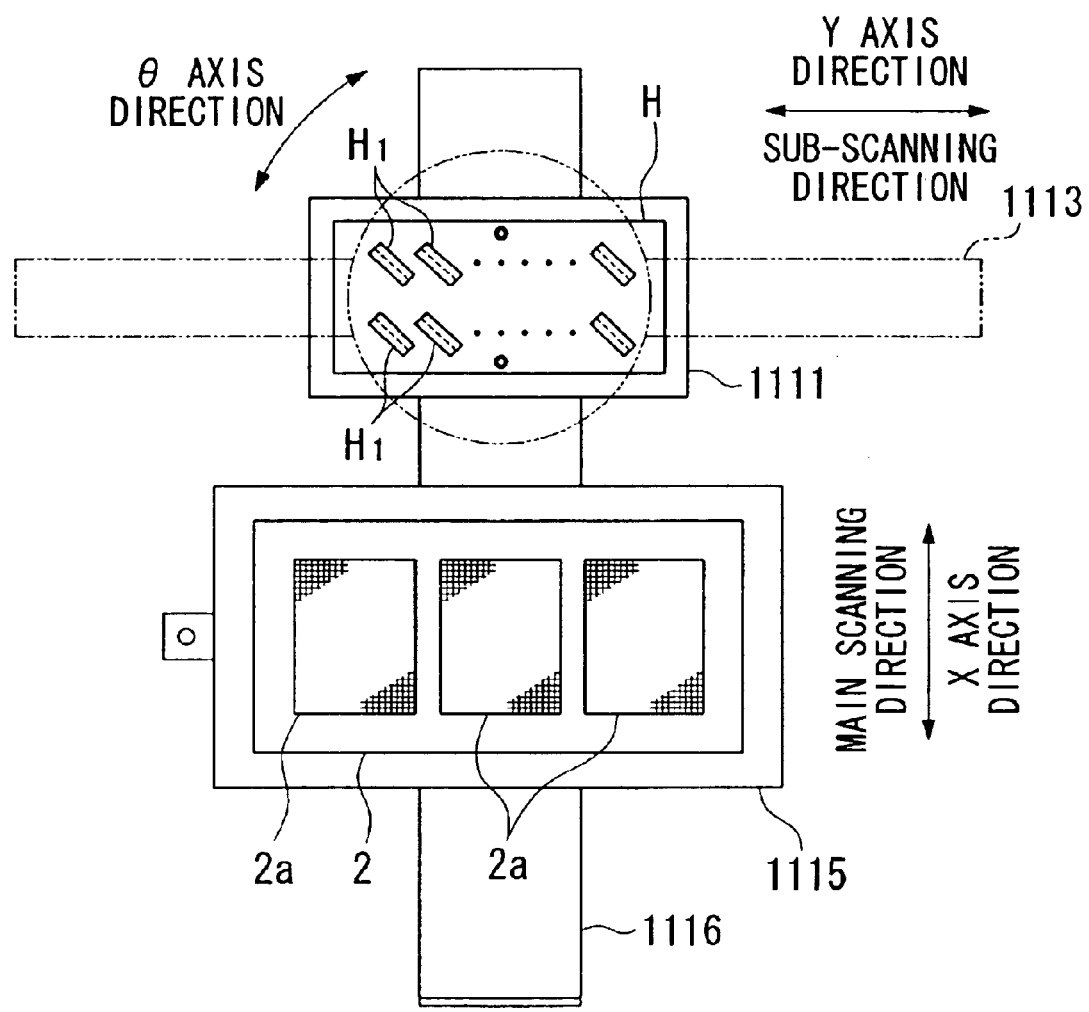
FIG. 12 is a plan view showing an ink jet device which is used for manufacturing a display device according to the first embodiment of the present invention.

Furthermore, the base body and the head H should preferably be disposed as shown in FIG. 12.

In the ink jet device shown in FIG. 12, reference numeral 1115 indicates a stage for mounting a base body 2 thereon. Reference numeral 1116 indicates a guide rail for guiding the stage 1115 in a X axis direction (main scanning direction) in the drawing. Also, the head H can move in a y axis direction (sub-scanning direction) via the supporting member 1111 by using the guide rail 1113. Furthermore, the head H can rotate in a θ axis direction so as to incline the ink jet head H1 in a predetermined angle to the main scanning direction.

In the base body 2 shown in FIG. 12, a plurality of chips are disposed on a mother base board. That is, an area for one chip is equivalent to one display device. Here, three display areas 2a are formed, although, the present invention is not limited in such a disposition. For example, when the composition is applied to the display area 2a which is disposed in a left-hand area of the base body 2 in the drawing, the head H is moved to a left-hand area in the drawing via the guide rail 1113. Simultaneously, the base body 2 is moved to an upper direction in the drawing via the guide rail 1116. During that period, the composition is applied while the base body 2 is scanned. Next, the base body 2 is moved in a right-hand direction in the drawing so as to apply the composition on the display area 2a in a center of the base body. Similarly to the above case, the composition is applied to the display area 2a which is disposed in a right-hand area in the drawing.

Figure 15:
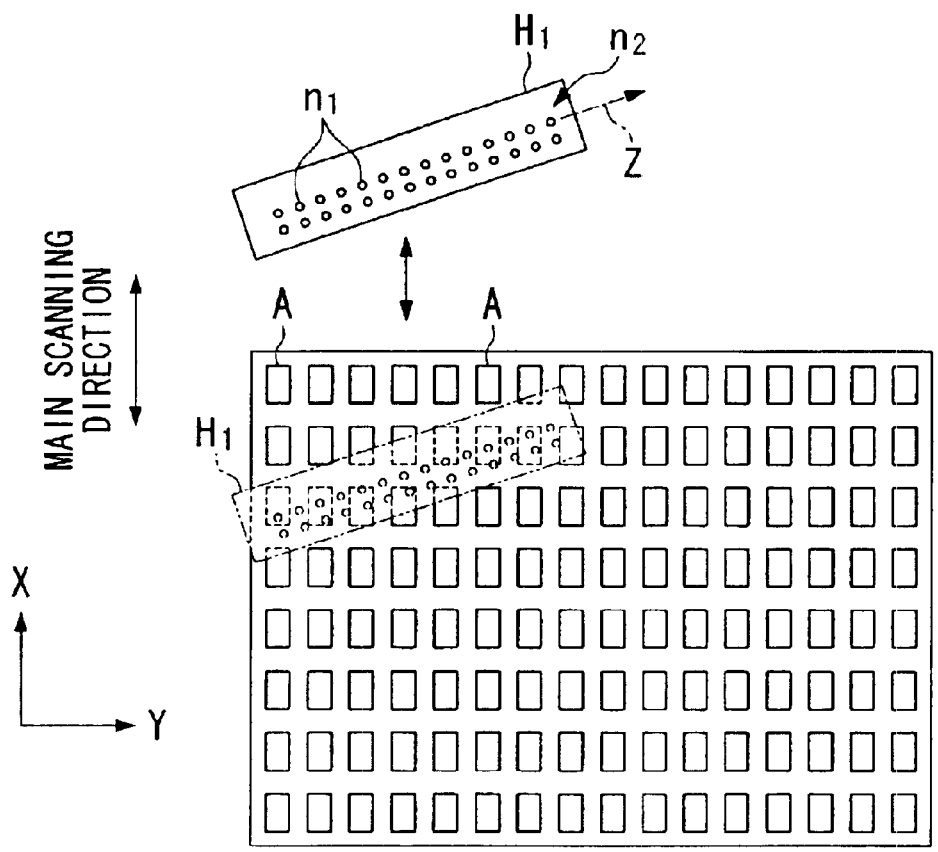
FIG. 15 is a plan view showing disposition condition of the ink jet head facing to a base body.

Here, the head H shown in FIG. 12 and the ink jet device shown in FIG. 15 can be used not only in the positive hole implantation/transportation layer forming process but also to the illuminating layer forming process.

Figure 13:
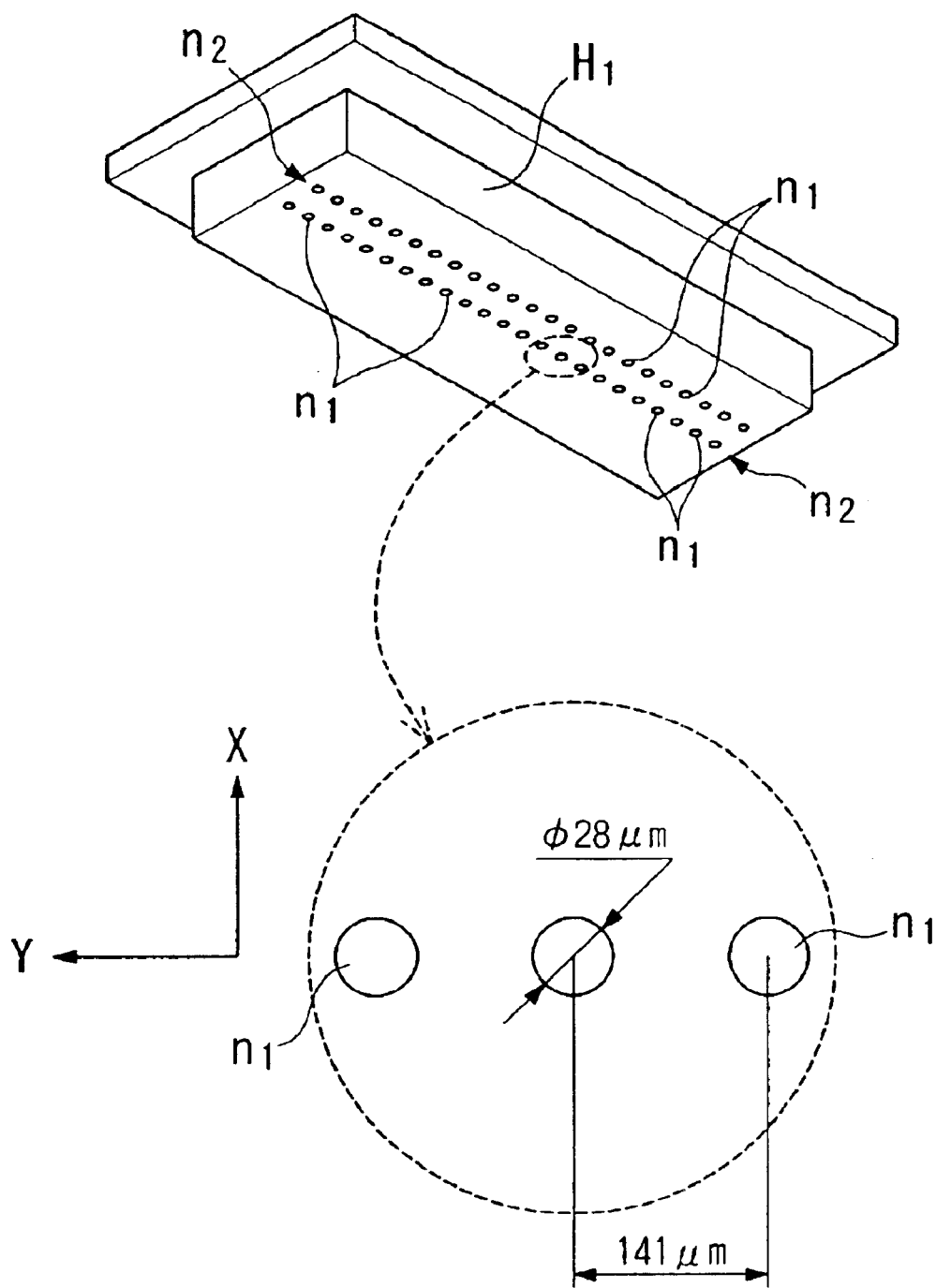
FIG. 13 is a perspective view for showing an example of an ink jet head which is used for manufacturing a display device according to the first embodiment of the present invention.

FIG. 13 is a perspective view of the ink jet head H1 viewed from near an area for injecting the ink. As shown in FIG. 13, a plurality of nozzles n1 are disposed in an array having intervals in a width direction of the head in a longitudinal direction of the head on an ink injecting surface (facing surface toward the base body) of the ink jet head H1. Two arrays of nozzle array N2 is formed by disposing a plurality of nozzles H2 in an array. 180 pieces of nozzle n1 are included in one nozzle array n2; thus, 360 pieces of nozzle are formed in one ink jet head H1. Also, diameter of hole in the nozzle n1 is, for example, 28 μm. Pitch between the nozzles n1 is, for example, 141 μm.

Figure 14A:
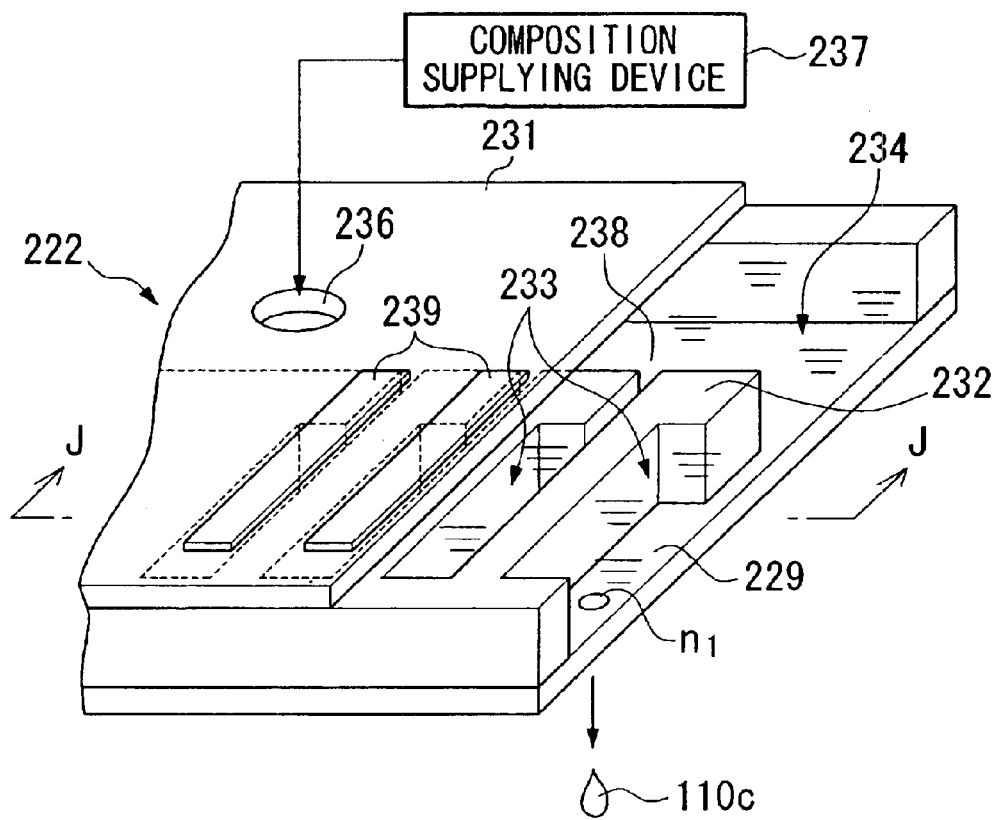
FIGS. 14A and 14B are views showing internal structure of the ink jet head shown in FIG. 13.
Figure 14B:
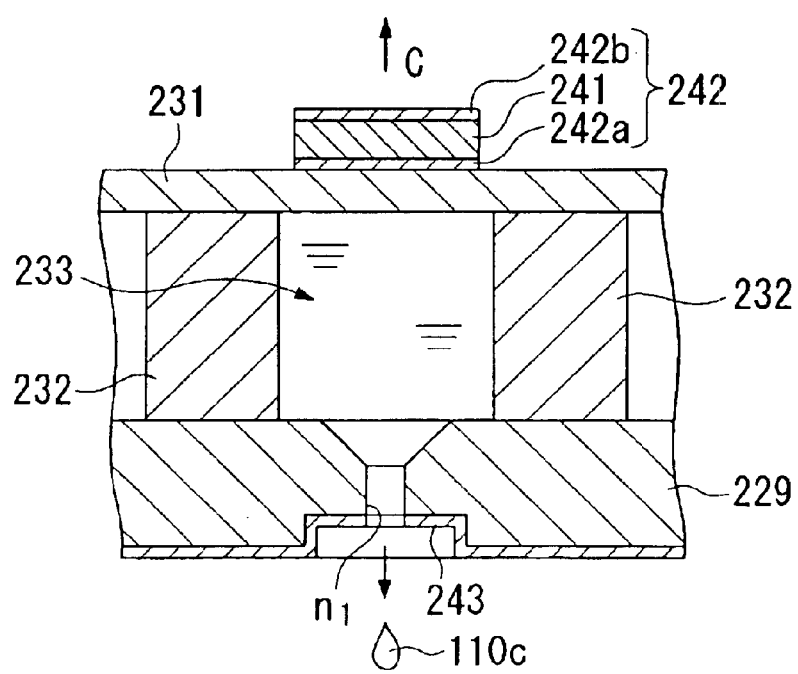

The ink jet head H1 has an internal structure shown in, for example, FIGS. 14A and 14B. More specifically, the ink jet head H1 has, for example, a nozzle plate 229 made of a stainless steel, a vibrating board 231 which faces the nozzle plate 229, and a separating member 232 for separating the nozzle plate 229 and the vibrating board 231. A plurality of composition chamber 233 and a liquid retaining chamber 234 are formed between the nozzle plate 229 and the vibrating board 231 by the separating member 232. A plurality of the composition chamber 233 and the liquid retaining chamber 234 are communicating each other via the path 238.

A composition supplying hole 236 is formed in and adequate position on the vibrating board 231. A composition supplying device 237 is connected to the composition supplying hole 236. The composition supplying device 237 supplies the first composition including the positive hole implantation/transportation layer forming member to the composition supplying hole 236. The supplied first composition is filled in the liquid retaining chamber 234. The supplied first composition is transmitted through the path 238 so as to be filled in the composition chamber 233.

A nozzle n1 is disposed in the nozzle plate 229 so as to inject the first composition under jet condition from the composition chamber 233. Also, a composition compressing member 239 is attached on a back surface of a surface on which the composition chamber 233 of the vibrating board 231 is formed so as to correspond to the composition chamber 233. The composition compressing member 239 has a piezoelectric element 241 and a pair of electrode 242a and 242b for sandwiching the piezoelectric element 241 as shown in FIG. 14B. The piezoelectric element 241 is deformed by an electric current flow to the electrodes 242a and 242b so as to protrude to the outside which is indicated by an arrow C in the drawing; thus, the volume of the composition chamber 233 increases. Consequently, the first composition having an equivalent volume of such increase passes through the path 238 from the liquid retaining chamber 234 so as to flow in the composition chamber 233.

Next, when the electric current flow to the piezoelectric element 241 is turned off, the shape of the piezoelectric element 241 and the vibrating board 231 recover to an initial form. By doing this, the shape of the composition chamber 233 recovers to the initial form. Therefore, the pressure in the first composition which is disposed inside of the composition chamber 233 increases; thus, the first composition is injected as a liquid drop 110c from the nozzle n1 toward the base body 2.

FIG. 15 shows an ink jet head H1 which is scanned to the base body 2. As shown in FIG. 15, the ink jet head H1 injects the first composition while moving relatively in a direction along the X axis direction in the drawing. During that period, a disposition direction Z of the nozzle array n2 is inclined to the main-scanning direction (direction along the X axis direction). The nozzle array n2 in the ink jet head H1 is disposed in an inclined position a condition to the main scanning direction. By doing this, it is possible to dispose the nozzle pitch so as to correspond to pitches in the pixel area A. Also, it is possible to correspond to various pitches in the pixel area A by adjusting the inclination angle.

Figure 16:
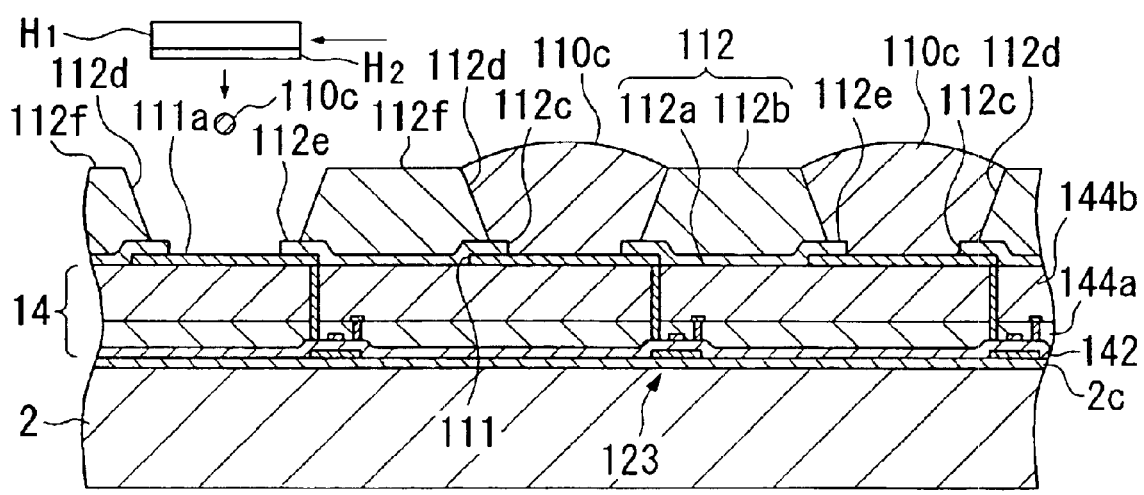
FIG. 16 is a cross section showing a manufacturing method for which is used for manufacturing a display device according to the first embodiment of the present invention.

As shown in FIG. 16, the first composition including the positive hole implantation/transportation layer forming member is injected from a plurality of nozzles n1 which are formed in the ink jet head H1. Here, the first composition is replenished in each pixel area A by scanning the ink jet head H1. Such an operation can be performed by scanning the base body 2. Furthermore, the first composition can be replenished by moving the ink jet head H1 and the base body 2 relatively. Here, in the processes using the ink jet head hereafter are performed in the same manner as the above explanation.

An injection operation is performed by the ink jet head as follows. That is, an injection nozzle H2 which is formed in the ink jet head H1 is disposed so as to face the electrode surface 111a and the first composition is injected from the nozzle H2. A bank 112 which separates the opening section 112g is formed around the pixel electrode 111. The ink jet head H1 disposed so as to face the opening section 112g. The a first composition drop 110c of which amount per one drop is controlled is injected into the opening section 112g shown in FIG. 3 from the injection nozzle H2 by moving the ink jet head H1 and the base body 2 relatively. The liquid drops which are injected into an opening section 112g can be six drops to 20 drops. Such a range depends on an area of the pixel; thus it is acceptable if the liquid drops are out of the above range.

Figure 17A:
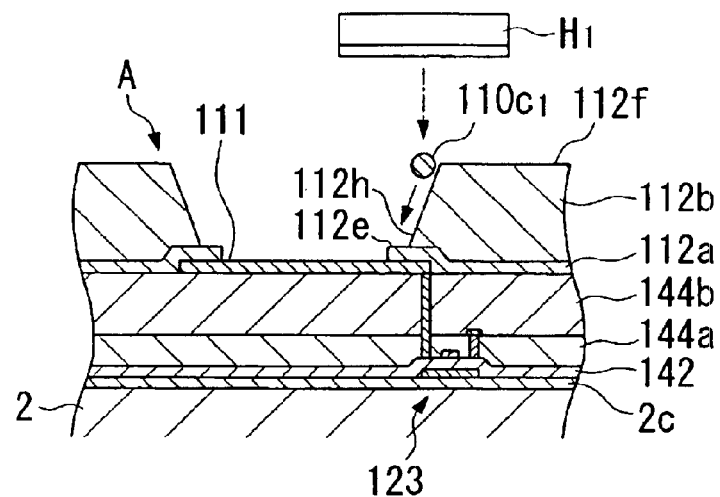
FIGS. 17A to 17C are views for showing manufacturing method for a display device according to the first embodiment of the present invention.

Here, as shown in FIGS. 16 and 17A, it is necessary that an initial liquid drop 110c1 which is injected to an opening section 112g be injected so as to contact the wall surface 112h which is inclining in the organic bank layer 112b. The wall surface 112h in the organic bank layer 112b is processed to be water-repellant in the previous water-repellant process; therefore, the injected liquid drop 110c1 contacts the wall surface 112h and is repelled there immediately. The liquid drop 110c1 is transported on the wall surface 112h so as to be dropped on the first layer section 112e. The first layer section 112e is processed to be lyophilic; therefore, it is acceptable if the dropped initial liquid drop 110c1 spreads on the first layer section 112e. Here, it is acceptable if the initial liquid drop 110c1 contacts at least a part of the wall surface 112h in the organic bank layer 112b. Also, it is acceptable that the initial liquid drop 110c1 be injected so as to contact the wall surface 112h and the upper surface 112f on the organic bank layer 112f simultaneously.

Figure 17B:
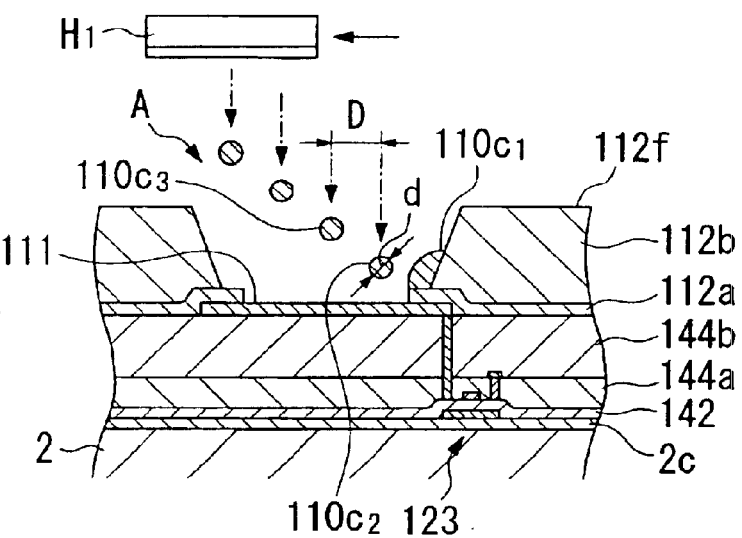

Consequently, liquid drops 110c2 which are injected after the liquid drop 110c1 are injected by an interval so as not to overlap the previous liquid drop 110c1 as shown in FIG. 17B. That is, it is preferable that an interval D for dropping the liquid drops 110c1 and 110c2 be larger than a diameter d of the liquid drops (D>d). Here, in this case, the liquid drops which can be injected in one scanning operation is limited. Therefore, it is preferable that the ink jet head H1 scans one pixel area A plural times so as to form a positive hole implantation/transportation layer having sufficient thickness.

Furthermore, it is preferable that the injection operation is performed by using other nozzle n1 instead of a particular nozzle n1 by slightly shifting the ink jet head H1 in a sub-scanning direction which is orthogonal to the main scanning direction when the scanning operation by the ink jet head H1 is performed plural times each time. Thus, it is possible to realize an effect of error diffusion in which an error in the liquid drop amount diffuses in the nozzle by performing the injection operation by a plural nozzle to a pixel area A. Therefore, it is possible to form a positive hole implantation/transportation layer in a uniform thickness.

Figure 17C:
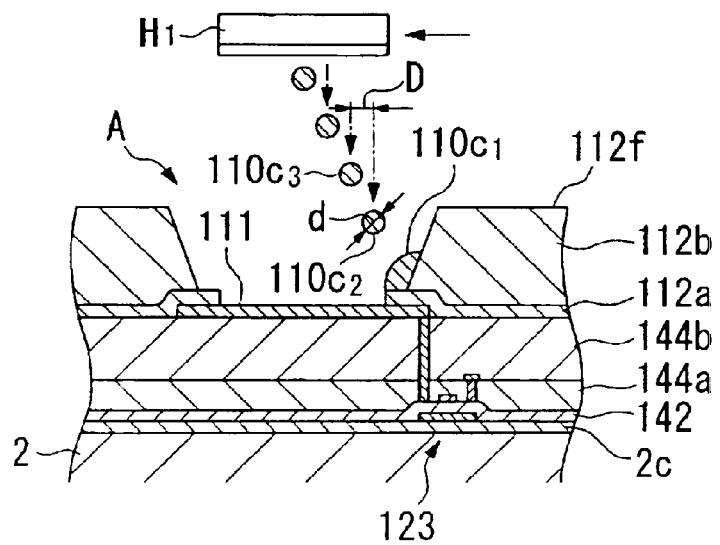

Also, as shown in FIG. 17C, it is acceptable that the liquid drops 110c2 be injected in an interval in which the liquid drop 110c2 overlaps the initial liquid drop 110c1 after the initial liquid drops are injected. That is, it is acceptable that the interval D between the initial liquid drop 110c1 and the liquid drop 10c2 is narrower then a diameter d of each liquid drop (D<d). Here, in this case, the liquid drops which can be injected in one scanning operation are not limited; therefore, it is acceptable if the scanning operation by the ink jet head H1 to a pixel area A is performed once or plural times for forming a positive hole implantation/transportation layer having sufficient thickness. In a case in which the scanning operation by the ink jet head H1 is performed plural times, it is preferable that the ink jet head H1 be shifted in the sub-scanning direction each time of the scanning operation similarly to the previous case and the injection operation be performed by using other nozzle nl instead of a particular nozzle n1. In the case in which the injection operation is performed to a pixel area A by using a plurality of nozzles, it is possible to form the positive hole implantation/ transportation layer on each pixel area A in a uniform thickness because of the error diffusion effect similarly to the above case.

In particular, in a case in which the scanning operation by the ink jet head H1 to a pixel area A is performed twice, it is acceptable that a first scanning direction and a second scanning direction be opposite. Also, it is acceptable that a first scanning direction and a second scanning direction be the same.

In a case in which a first scanning direction and a second scanning direction are opposite, it is acceptable that the first composition be injected in half an area in the pixel area A in the first scanning operation and the first composition is injected in the rest of the area in the second scanning operation. Also, it is possible to perform the second scanning operation so as to cover the area which is formed in the first scanning operation.

Furthermore, in a case in which a first scanning direction and a second scanning direction are the same, it is acceptable that the injection operation be performed in the first scanning operation so as to have an interval in which the liquid drops do not overlap each other and the injection operation is performed in the second scanning operation so as to cover a space made in the previous injection operation. Certainly, it is possible to perform an injection operation so as to separate a pixel area into two areas.

For the first composition which is used here, for example, a composition which is made by solving a mixture of polythiophene derivative such as polyethylene dioxythiophene (PEDOT) and polystyrene sulfonic acid (PSS) in a polar solvent can be used. For a polar solvent, for example, isopropyl alcohol (IPA), n-butanol, y-butyrolactone, N-methylpyrrolidone (NMP), 1,3-dimethyl-2-imidazolidinone (DMI) and its derivative, glycol esters such as arbitol acetate, and butylcarbitol acetate can be named.

For more specific structure of the first composition, conditions such as PEDOT/PSS mixture (PEDOT/PSS=1:20):

12.52 weight %, PSS:1.44 weight %, IPA:10 weight %, NMP:27.48 weight %, DMI: 50 weight % can be proposed. Here, the viscousity of the first composition should preferably be nearly 2 to 20 Ps, in particular, 4 to 15 cPs.

By using the above first composition, it is possible to perform an injection operation stably without clogging the injection nozzle H2.

Here, a common member for a positive hole implantation/transportation layer forming member can be used for forming illuminating layers 110b1 to 110b3 for red (R), green (G), and blue (B). Also, a different member for a positive hole implantation/transportation layer forming member can be used.

As shown in FIG. 16, the liquid drop 110c of the injected first composition spreads on the electrode surface 111a to which a lyophilic process is performed and the first layer section 112e finally so as to be replenished in the lower opening section 112c and the upper opening section 112d. If the liquid drop 110c of the first composition is injected on the upper surface 112f which is outside of the predetermined injection position, the first composition drop 111c does not spread on the upper surface 112f; the repelled first composition drop 110c is transported into the lower opening section 112c and the upper opening section 112d.

Total amount of the first composition which is injected on the electrode surface 111a is determined by factors such as size of the lower opening section 112c, a size of the upper opening section 112d, the thickness of the positive hole implantation/transportation layer, and the density of the positive hole implantation/transportation layer in the first composition, or the like.

Figure 18:
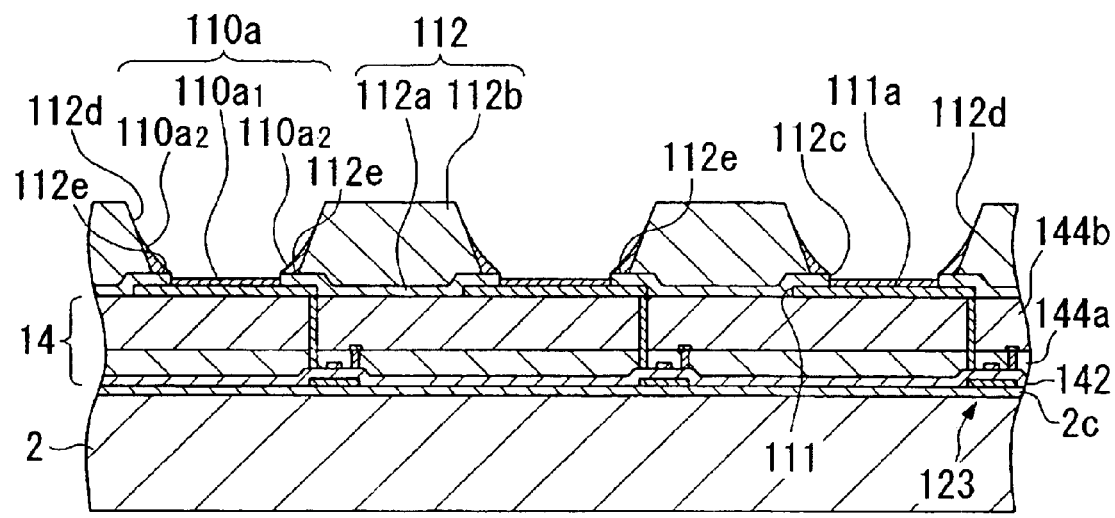
FIG. 18 is a cross section showing a manufacturing method for a display device according to the first embodiment of the present invention.

Next, a drying process is performed as shown in FIG. 18. In the drying process, the injected first composition is dried, a polar solvent which is included in the first composition is evaporated; thus, the positive hole implantation/transportation layer 110a is formed.

In the drying process, the polar solvent which is included in the composition drop 110c is evaporated near the inorganic bank layer 112a and the organic bank layer 112b. Together with the evaporation of the polar solvent, the positive hole implantation/transportation layer is condensed and extracted.

By doing this, a periphery section 110a2 made from the positive hole implantation/transportation layer is formed on the first layer section 112e as shown in FIG. 18. The periphery section 110a is attached on the wall surface (organic bank layer 112b) in the upper opening section 112d closely. The thickness of the periphery section 110a2 is thin near the electrode surface 1a and thick near the organic bank layer 112b farther from the electrode surface 111a.

Also, simultaneously, the polar solvent is evaporated on the electrode surface 111a in the drying process. By doing this, a flat section 110a1 made from the positive hole implantation/transportation layer forming member is formed on the electrode surface 111a. Evaporation speed of the polar solvent is approximately uniform on the electrode surface 111a. Therefore, the positive hole implantation/transportation layer 1 forming member is condensed on the electrode surface 111a uniformly. By doing this, a flat section 110a having uniform thickness is formed.

In this way, the positive hole implantation/transportation layer 110a made from the periphery section 110a2 and the flat section 110a1 is formed.

Here, it is acceptable that the positive hole implantation/transportation layer be formed not on the periphery section 110a2 but only on the electrode surface 111a.

The above drying process is performed under condition of, for example, nitrogen atmosphere under pressure of 133.3 Pa (1 Torr) in the room temperature. If the pressure is too low, it is not preferable because the first composition drop is boiled. If the temperature is higher than the room temperature, the evaporation speed of the polar solvent increases; thus, it is not possible to form a flat layer.

After the drying process, it is preferable that the polar solvent and a water which remain in the positive hole implantation/transportation layer 110a are eliminated by heating the positive hole implantation/transportation layer 110a in the nitrogen atmosphere or under vacuum condition in 200° C. for nearly ten minutes.

In the above positive hole implantation/transportation layer forming process, the injected first composition drop 110c is replenished in the lower opening section 112c and the upper opening section 112d. On the other hand, the first composition is repelled in the organic bank layer 112b to which the water-repellant process is performed so as to be transported in the lower opening section 112c and the upper opening section 112b by doing this, it is possible to replenish the injected first composition drop 110c in the lower opening section 112c and the upper opening section 112d; thus, it is possible to form the positive hole implantation/transportation layer 110a on the electrode surface 111a.

In the above positive hole implantation/transportation layer forming process, the first composition drop 110c1 which is injected initially for each pixel electrode A contacts the wall surface 112h in the organic bank layer 112b. Therefore, the liquid drop is transported to the first layer section 112e and the pixel electrode surface 111a from the wall surface 112h; thus, it is possible to spread the first composition drop 110c around the pixel electrode 111 preferentially so as to apply the first composition uniformly. By doing this, it is possible to form the positive hole implantation/transportation layer 110a having approximately uniform thickness.

(4) Illuminating Layer Forming Process

Next, an illuminating layer forming process comprises surface refining process, illuminating layer forming member injecting process, and drying process.

First, the surface refining process is performed so as to refine a surface of the positive hole implantation/transportation layer 110a. This process is explained later. Next, a second composition is injected on the positive hole implantation/transportation layer 110a by ink jet method similarly to the case of the above positive hole implantation/transportation layer forming process. After that, the injected second composition is dried (thermally processed) so as to form an illuminating layer 110b on the positive hole implantation/transportation layer 110a.

In the illuminating layer forming process, a non-polar solvent which is not soluble in the positive hole implantation/transportation layer 110a is used for the second composition which is used for forming the illuminating layer so as to prevent the positive hole implantation/transportation layer 110a from being melted again.

However, on the other hand, lyophilic characteristics in the positive hole implantation/transportation layer 110a to the non-polar solvent is low. Therefore, there is a concern that the positive hole implantation/transportation layer 110a and the illuminating layer 110b do not contact closely even if the second composition including the non-polar solvent is injected on the positive hole implantation/transportation layer 110a or the illuminating layer 110b cannot be applied uniformly.

Accordingly, it is preferable to perform the surface refining process before forming the illuminating layer so as to enhance the lyophilic characteristics in a surface of the positive hole implantation/transportation layer 110a against the non-polar solvent and the illuminating layer forming member.

Here, the surface refining process is explained.

In the surface refining process, the non-polar solvent for the first composition which is used in the illuminating layer forming process and a surface refining member which is a solvent equivalent or the same as the above non-polar solvent are applied on the positive hole implantation/transportation layer 110a by ink jet method (liquid drop injecting method), spin coat method, or dipping method, and drying operation is performed.

Figure 19:
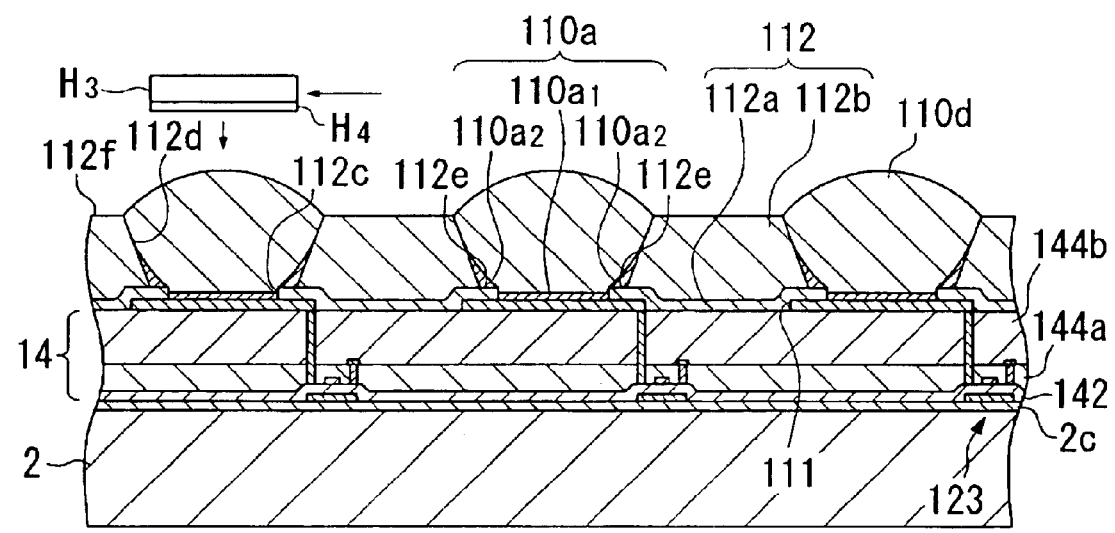
FIG. 19 is a cross section showing a manufacturing method for a display device according to the first embodiment of the present invention.

In the ink jet method, as shown in FIG. 19, the surface refining member is replenished in the ink jet head H3. The surface refining member is injected from the injection nozzle H4 which is formed in the ink jet head H3. The injection nozzle H4 is disposed so as to face the base body 2 (a base body 2 in which the positive hole implantation/transportation layer 110a is formed) similarly to a case of the above positive hole implantation/transportation layer forming process. While moving the ink jet head H3 and the base body 2 relatively, the surface refining member 110d is injected from the injection nozzle H4 on the positive hole implantation/transportation layer 110a.

In the spin coat method, the base body 2 is mounted on, for example, a rotating stage and the surface refining member is dropped on the base body 2 from above. After that, the base body 2 is rotated so as to spread the surface refining member on an entire surface for the positive hole implantation/transportation layer 110a on the base body 2. Here, the surface refining member spreads on the upper surface 112f to which the lyophilic process is performed temporarily. However, the surface refining member is repelled due to a centrifugal force; thus, the surface refining member is applied only on the positive hole implantation/transportation layer 110a.

Furthermore, in the dipping method, the base body 2 is soaked in, for example, the surface refining member and raised so as to spread the surface refining member on the positive hole implantation/transportation layer 110a entirely. In this case, the surface refining member also temporarily spreads on the lyophilically processed upper surface 112f. However, the surface refining member is repelled from the upper surface 112f when the base body 2 is raised; thus, the surface refining member is applied only on the positive hole implantation/transportation layer 110a.

For a surface refining member which is the same as the non-polar solvent for the second composition to be used here, cyclohexylbenzene, dihydrobenzofuran, trimethylbenzene, tetramethylbenzene can be named. For a surface refining member which is equivalent to the non-polar solvent for the second composition, for example, toluene and xylene can be named.

In particular, in the ink jet method, it is preferable to use dihydrobenzofuran, trimethylbenzene, tetramethylbenzene, cyclohexylbenzene, and a mixture of the above member, in particularly a solvent mixture which is the same as the second composition.

In the spin coat method or the dipping method, toluene, xylene and the like are preferable.

Figure 20:
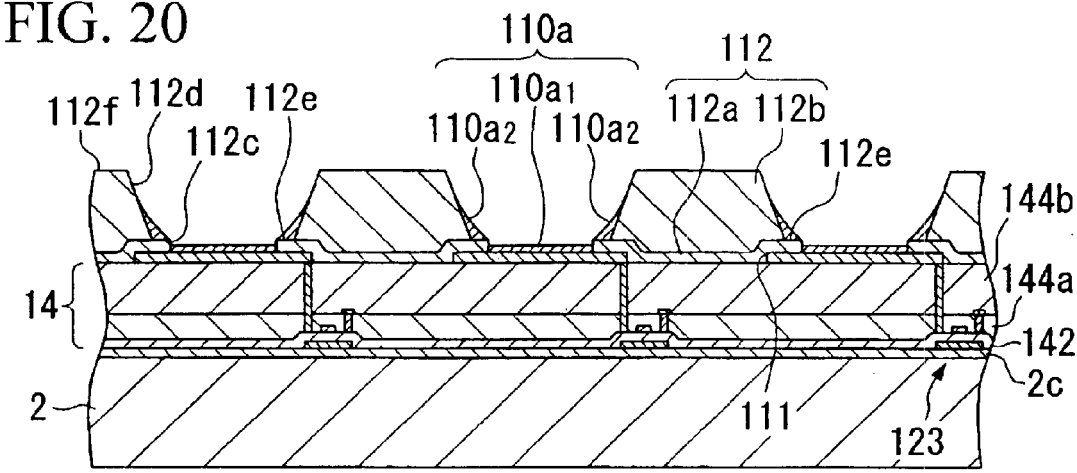
FIG. 20 is a cross section showing a manufacturing method for a display device according to the first embodiment of the present invention.

Next, as shown in FIG. 20, an application area is dried. In a drying process in the ink jet method, the base body 2 is mounted on a hot plate so as to be heated in, for example, 200° C. or lower so as to dry and dehydrate. In a spin coat method or the dipping method, it is preferable that nitrogen be blown to the base body, or the base body is rotated so as to generate an air flow on a surface of the base body 2 so as to dry and dehydrate it.

Here, it is acceptable that the surface refining member be applied after the drying operation in the positive hole implantation/transportation layer forming process and a heating process in the positive hole implantation/transportation layer forming process is performed after drying the surface refining member which is applied thereon.

By performing such surface refining process, the surface of the positive hole implantation/transportation layer 110a becomes lyophilic to the non-polar solvent; thus, it is possible to apply the second composition which includes the illuminating layer forming member on the positive hole implantation/transportation layer 110a uniformly in the latter process.

Here, it is acceptable that the compound 2 which is generally used for a positive hole transporting member be dissolved in the above surface refining member so as to make a composition. The composition is applied on the positive hole implantation/transportation layer by ink jet method and dried; thus, the positive hole extremely thin transporting layer may be formed on the positive hole implantation/transportation layer.

Approximately the entire part of the positive hole implantation/transportation layer is soluble in the illuminating layer 110b which is applied in the latter process. However, a part of the positive hole implantation/transportation layer remains between the positive hole implantation/transportation layer 110a and the illuminating layer 110b in a thin layer form. By doing this, it is possible to reduce an energy barrier between the positive hole implantation/transportation layer 110a and the illuminating layer 110b; thus, the positive hole can move easily. Therefore, it is possible to enhance the illuminating efficiency.

Next, in the illuminating layer forming process, the second composition which includes the illuminating layer forming member is injected on the positive hole implantation/transportation layer 110a by ink jet method (liquid drop injecting method). After that, drying operation is performed so as to form the illuminating layer 110b on the positive hole implantation/transportation layer 110a.

Figure 21:
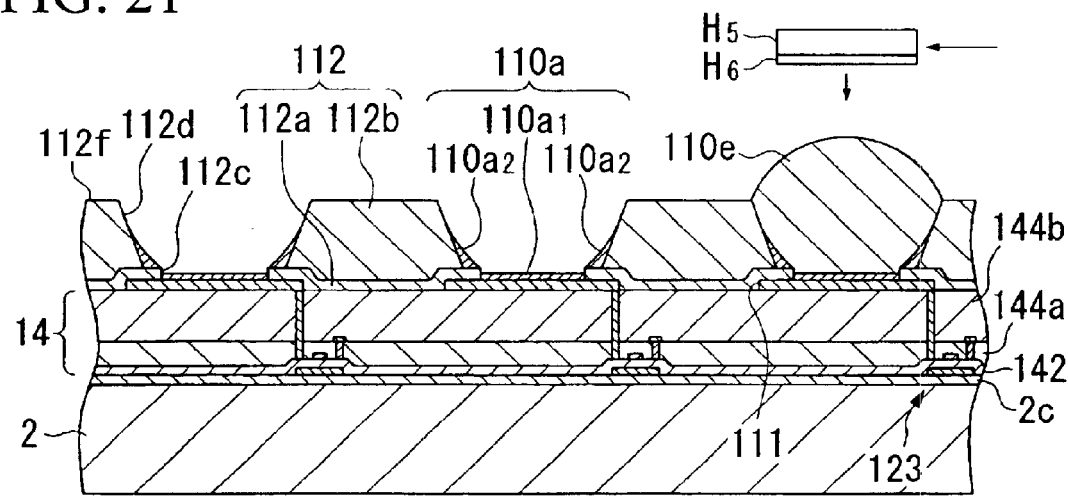
FIG. 21 is a cross section showing a manufacturing method for a display device according to the first embodiment of the present invention.

FIG. 21 is a general view for showing injection method by using an ink jet. As shown in FIG. 21, the ink jet head H5 and the base body 2 are moved relatively. The second composition which includes the illuminating layer forming members for each color (for example, blue (B)) is injected from the injection nozzle H6 which is formed in the inkjet head.

In the injection operation, the injection nozzle is disposed so as to face the positive hole implantation/transportation layers 110a which are disposed in the lower opening section 112c and the upper opening section 112d. The second composition is injected while the ink jet head H5 and the base body 2 are moved relatively. The amount per one time of the liquid injection from the injection nozzle H6 is controlled. In this way, the amount of the liquid (second composition liquid 110e) which is injected from the injection head. Thus, the second composition liquid 110e is injected on the positive hole implantation/transportation layer 110a.

In the illuminating layer forming process, the initial liquid drop is injected so as to contact the bank section 112 similarly to a case of the positive hole implantation/transportation layer forming process. It is acceptable that a second liquid drop is injected so as to overlap the initial liquid drop. Also, it is acceptable that a second liquid drop is injected so as to have an interval to the initial liquid drop.

Furthermore, it is acceptable that the scanning operation be separated into two operations per one pixel area.

That is, similarly to a case shown in FIGS. 16 and 17A, the initial liquid drop of the second composition is injected toward an opening section 112g so as to contact the inclined wall surface 112h in the organic bank layer 112b. The wall surface 112h in the organic bank layer 112b is processed to be water-repellant in the water-repellant process; therefore, the injected liquid drop contacts the wall surface 112h and is repelled there immediately so as to be transported on the wall surface 112h and drops on the positive hole implantation/transportation layer 110a. The positive hole implantation/transportation layer 110a is processed to be lyophilic with the non-polar solvent in the surface refining process; therefore, the liquid drop which is transported and dropped there spreads on the positive hole implantation/transportation layer 110a. Here, it is acceptable that the initial liquid drop contact at at least a part of the wall surface 112h in the organic bank layer 112b. Also, the initial liquid drop may be injected so as to contact the upper surface 112f and the wall surface 112h in the organic bank layer simultaneously.

Consequently, the liquid drops which are injected later than the second liquid drops are injected so as not to overlap the previous liquid drops similarly to a case shown in FIG. 17B. That is, it is preferable that an interval D between the dropping liquid drops be larger than a diameter in each liquid drop (D>d). Here, in this case, the liquid drop which is injected is limited in one scanning operation; therefore, it is preferable that the scanning operation for on pixel area A by the ink jet head H5 be performed plural times so as to form an illuminating layer 112b having sufficient thickness.

Furthermore, when the scanning operation is performed plural times by the ink jet head H5, the ink jet head H5 is slightly shifted in a sub-scanning direction orthogonal to the main scanning direction in each scanning operation. It is preferable that the injection operation is performed by using other nozzle instead of a particular nozzle. In this way, the injection operation is performed by using a plurality of nozzles to one pixel area A; thus, an error diffusion effect in which an error which is original in the liquid drop amount diffuses can be realized; thus, it is possible to form the illuminating layer 112b in a uniform thickness.

Also, as shown in FIG. 17C, it is acceptable that the liquid drops after the initial liquid drops are injected in an interval in which the liquid drop overlaps the initial liquid drop. That is, it is acceptable that the interval D between the initial liquid drop and the liquid drop is narrower then a diameter d of each liquid drop (D<d). Here, in this case, the liquid drops which can be injected in one scanning operation are not limited; therefore, it is acceptable if the scanning operation by the ink jet head H5 on a pixel area A is performed once or plural times for forming an illuminating layer 112b having sufficient thickness. In a case in which the scanning operation by the ink jet head H5 is performed plural times, it is preferable that the ink jet head H5 is shifted in the sub-scanning direction each time of the scanning operation similarly to the previous case and the injection operation is performed by using other nozzle instead of a particular nozzle. In a case in which the injection operation is performed to a pixel area A by using a plurality of nozzles, it is possible to form the illuminating layer 112b on each pixel area A in a uniform thickness because of the error diffusion effect similarly to the above case.

In particular, in a case in which the scanning operation by the ink jet head H5 to a pixel area A is performed twice, it is acceptable that a first scanning direction and a second scanning direction be opposite. Also, it is acceptable that a first scanning direction and a second scanning direction be the same.

In a case in which a first scanning direction and a second scanning direction are opposite, it is acceptable that the first composition be injected in half an area in the pixel area A in the first scanning operation and the first composition be injected in the rest of the area in the second scanning operation. Also, it is possible to perform the second scanning operation so as to cover the area which is formed in the first scanning operation.

Furthermore, in a case in which a first scanning direction and a second scanning direction are the same, it is acceptable that the injection operation is performed in the first scanning operation so as to have an interval in which the liquid drops do not overlap each other and the injection operation is performed in the second scanning operation so as to cover a space made in the previous injection operation. Certainly, it is possible to perform an injection operation so as to separate a pixel area into two areas.

For an illuminating layer forming member, polyfluorene derivatives shown in the above compounds 1 to 5, (poly-)p-phenylene vinylene derivative, polyphenylene derivative, polyvinyl carbazole, polythiophene derivative, perylene dye, coumarin dye, rhodamine dye can be used. Also an organic EL member can be doped to the above polymers to be used for an illuminating layer forming member. For example, rubrene, perylene, 9,10-diphenylanthracene, tetraphenylbutadiene, Nile red, coumarin 6, quinacridone can be doped to the above polymers.

A non-polar solvent should preferably not be soluble in the positive hole implantation/transportation layer 110a. For example, cyclohexylbenzene, dihydrobenzofuran, trimethylbenzene, tetramethylbenzene, can be used.

By using such non-polar solvent for the second composition in the illuminating layer 110b, it is possible to apply the second composition without re-melting the positive hole implantation/transportation layer 110a.

As shown in FIG. 21, the injected second composition 110e spreads on the positive hole implantation/transportation layer 110a and is replenished in the lower opening section 112c and the upper opening section 112d. On the other hand, even if the first composition drop 110e is injected on the water-repellant upper surface 112f off the predetermined injection position, the upper surface 112f does not become wet by the second composition drop 110e; thus, the second composition drop 110e is transported in the lower opening section 112c and the upper opening section 112d.

The amount of the second composition which is injected on the positive hole implantation/transportation layer 110a depends on factors such as the size of the lower opening section 112c, the size of the upper opening section 112d, the thickness of the illuminating layer 110b which is intended to be formed, and the density of the illuminating layer in the second composition, and the like.

Also, it is acceptable that the second composition 110e is injected on the same positive hole implantation/transportation layer 110a not only once but also in plural times. In this case, the amount of the second composition in each time of the injection can be the same. It is also acceptable that the liquid amount of the second composition change in each injection. Furthermore, it is acceptable that the second composition be disposed and injected not only in the same position on the positive hole implantation/transportation layer 110a but also in different positions in the positive hole implantation/transportation layer 110a in each time of the injection operation.

Figure 22:
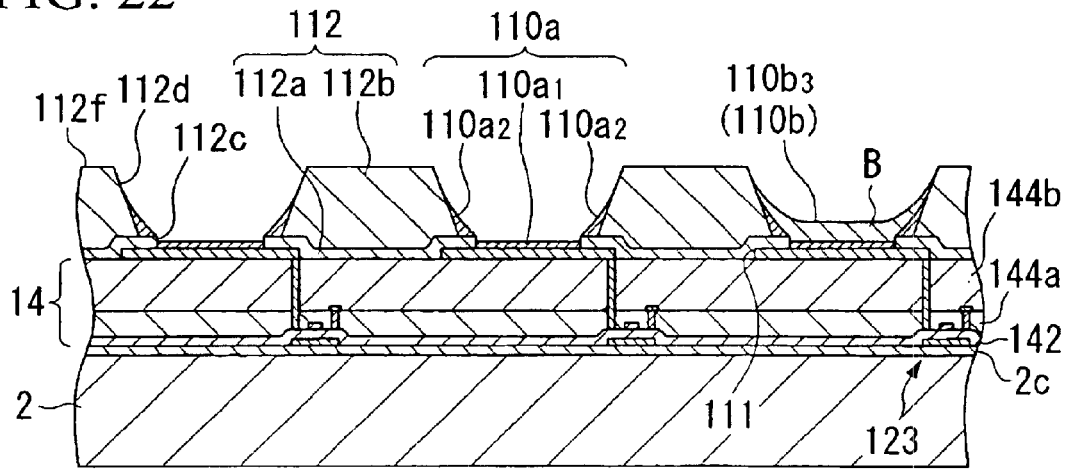
FIG. 22 is a cross section showing a manufacturing method for a display device according to the first embodiment of the present invention.

Next, the second composition is injected on the predetermined position, and after that, the injected second composition drop 110e is processed to be dried. By doing this, the illuminating layer 110b3 is formed. That is, by performing the drying operation, the non-polar solvent which is included in the second composition evaporates and a blue (B) illuminating layer 110b3 is formed as shown in FIG. 22. Here, in FIG. 22, only one illuminating layer which illuminates in blue is shown. As shown in FIG. 1 or in other drawings, illuminating elements are formed in a matrix essentially; thus, it is should be understood that numerous illuminating layers which are not shown in the drawing (corresponding to blue) are formed.

Figure 23:
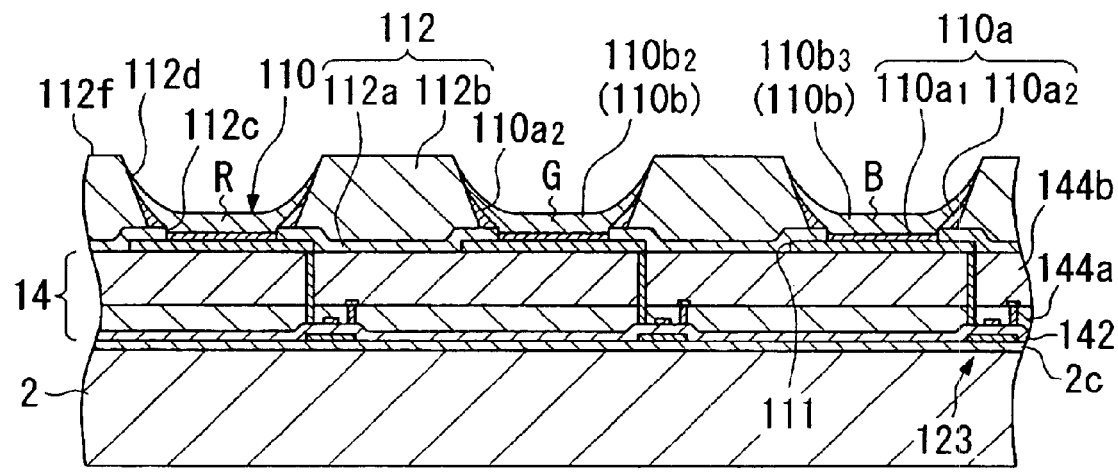
FIG. 23 is a cross section showing a manufacturing method for a display device according to the first embodiment of the present invention.

Consequently, as shown in FIG. 23, a red (R) illuminating layer 110b1 is formed in the same process as in the case of the above blue (B) illuminating layer 110b3. A green (G) illuminating layer 110b2 is formed last.

Here, the order for forming the illuminating layers is not limited to the above order. It is possible to form it in any forming order. For example, it is possible to determine the forming order according to the illuminating layer forming member.

For a drying condition for the second composition in the illuminating layer, for example, a condition such as 133.3 Pa (1 Torr) pressure with room temperature in a nitrogen atmosphere for 5 to 10 minutes can be proposed. If the pressure is too low, the second composition boils; thus, it is not preferable. Also, if the temperature is higher than room temperature, the evaporating speed in the non-polar solvent increases and numerous illuminating layers forming a member adhere to the wall surface in the upper opening section 112d; thus, it is not preferable.

Also, the green illuminating layer 110b2 and the red illuminating layer 110b2 have many ingredients for the illuminating layer forming member; thus, it is preferable to dry briefly. For example, it is preferable to perform nitrogen blowing operation for 5 to 10 minutes at 40° C.

For other drying conditions, it is possible to propose to use far infrared radiation methods, high temperature nitrogen gas blowing methods, and the like.

In this way, the positive hole implantation/transportation layer 110a and the illuminating layers 110b are formed on the pixel electrode 111.

(5) Facing Electrode (Cathode) Forming Process

Figure 24:
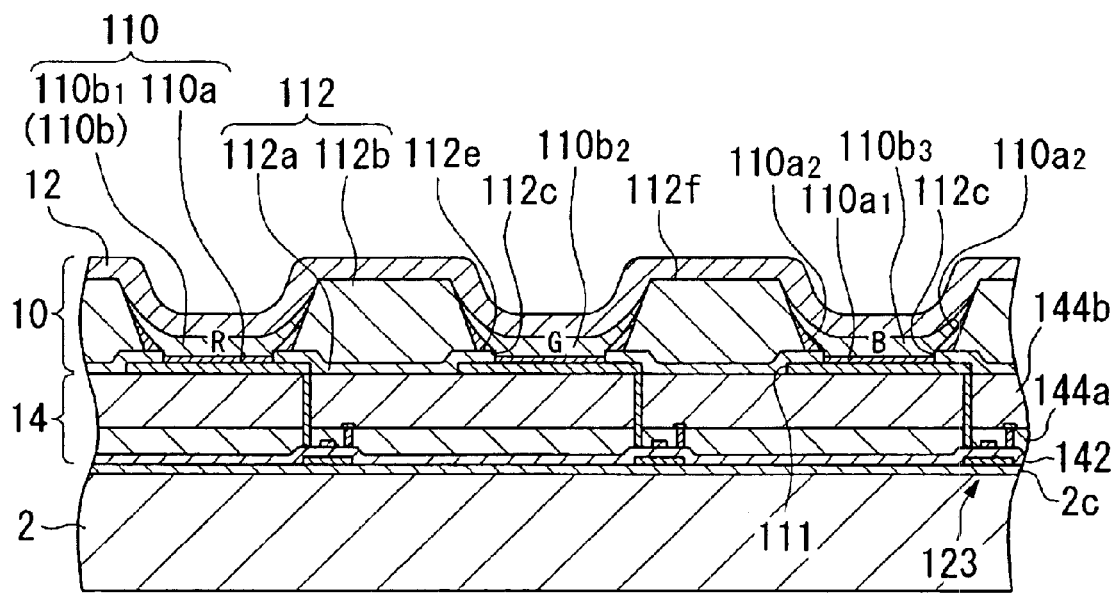
FIG. 24 is a cross section showing a manufacturing method for a display device according to the first embodiment of the present invention.

Next, in the facing electrode forming process, as shown in FIG. 24, a cathode 12 (facing electrode) is formed on an entire surface of the illuminating layers 110b and the organic bank layer 112b. Here, it is acceptable that the cathode 12 is formed by layering a plurality of members. For example, it is preferable that a member having a small work function be formed near the illuminating layers. For example, it is possible to use Ca, Ba, and the like. Also, there is a case in which an LiF and the like is formed thereunderneath thinly. Also, it is possible for a member having a higher work function such as Al to be used thereabove (sealing area) than that thereunderneath.

These cathodes 12 should preferably be formed by, for example, vacuum evaporation method, sputtering method, and CVD method and the like. In particular, it is preferable to form them by a vacuum evaporation method so as to prevent damages in the illuminating layers 110b due to heat.

Also, it is acceptable that the lithium fluoride be formed only on the illuminating layers 110b. Furthermore, it is possible to form the lithium fluoride so as to correspond to the predetermined color. For example it is acceptable to form the lithium fluoride only on the blue (B) illuminating layer 110b3. In this case, an upper cathode layer 12 made from calcium contacts the red (R) illuminating layer 110b and the green (G) illuminating layer 110b2.

Also, it is preferable to use an Al layer or Ag layer of the like formed by vacuum evaporation method, sputtering method, CVD method and the like for an upper section of the cathode 12. Also, the thickness of the upper section of the cathode should preferably be in a range of nearly 100 to 1000 nm, in particular, nearly 200 to 500 nm. Also, it is acceptable to dispose a protecting layer such as $SiO_2$, SiN, or the like on the cathode 12 for preventing oxidization.

(6) Sealing Process

Finally, in a sealing process, the base body 2 on which the illuminating element is formed and a sealing base board 3b are sealed by a sealing resin 3a. For example, the seaing resin 3a made from a thermally-curable resin or an ultraviolet-ray-curable resin is applied on an entire surface of the base body 2. The sealing base board 3b is layered on the sealing resin 3a. In this process, the sealing section 3 is formed on the base body 2.

The sealing process should preferably be performed in an inert gas atmosphere such as nitrogen gas, argon gas, and helium gas. If the sealing process is performed in an atmosphere, a water and an oxygen invade in the cathode 12 if a defect such as a pin hole is formed on the cathode 12; thus, there is a concern that the cathode 12 will be oxidized. Therefore, this is not preferable.

Furthermore, the cathode 12 is connected to a wiring 5a on the base board 5 shown in FIGS. 2A to 2C as examples. Also, a wiring in a circuit element section 14 is connected to a driving IC 6. By doing this, a display device 1 according to the present embodiment is obtained.

Second Embodiment

Next, an example of an electronic apparatus having a display device according to the above first embodiment is explained.

Figure 25A:
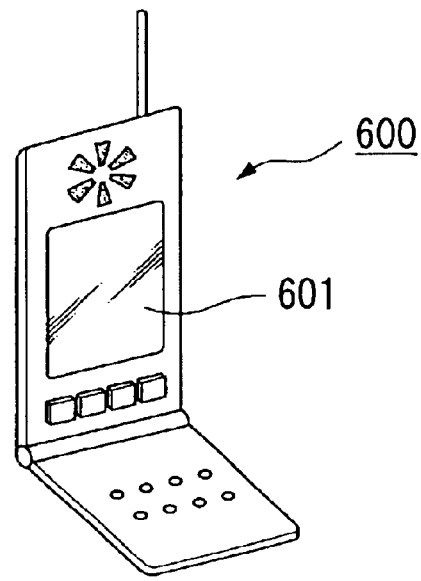
FIGS. 25A to 25C are perspective views for showing electronic apparatuses in a second embodiment of the present invention.

FIG. 25A is a perspective view showing an example of a mobile phone. In FIG. 25A, reference numeral 600 indicates a mobile phone unit. Reference numeral 601 indicates a display section using the above display device.

Figure 25B:
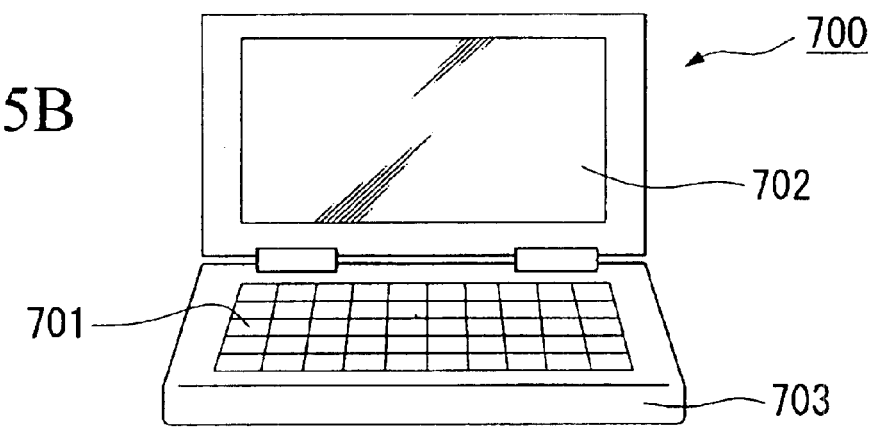

FIG. 25B is a perspective view showing an example for a mobile information processing device such as a word-processor and a personal computer. In FIG. 25B, reference numeral 700 indicates an information processing device. Reference numeral 701 indicates an input section such as a key-board. Reference numeral 3 indicates an information processing device unit. Reference numeral 702 indicates a display section using the above display device.

Figure 25C:
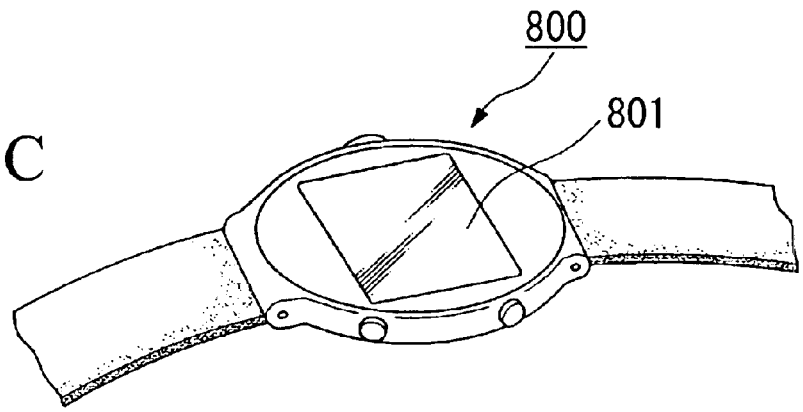

FIG. 25c is a perspective view showing an example for a watch electronic apparatus. In FIG. 25C, reference numeral 800 indicates a watch unit. Reference numeral 801 indicates a display section using the above display device.

Electronic apparatuses shown in FIGS. 25A to 25C are provided with a display section which has a display device according to the above first embodiment; thus, these electronic apparatuses have a feature of the display device according to the above first embodiment. Therefore, these electronic apparatuses have high brightness and superior display quality.

These electronic apparatuses are manufactured by forming a display device 1 having a driving IC 6 (driving circuit) shown in FIGS. 2A and 2B similarly to a case of the above first embodiment and by assembling the display device 1 in a mobile phone, a mobile information processing device, and a watch electronic apparatus.

The invention is described below, with reference to detailed illustrative embodiments. It will be apparent that the invention can be embodied in a wide variety of forms, some of which may be quite different from those of the disclosed embodiments. Consequently, the specific structural and functional details disclosed herein are merely representative and do not limit the scope of the invention.

Figure 26:
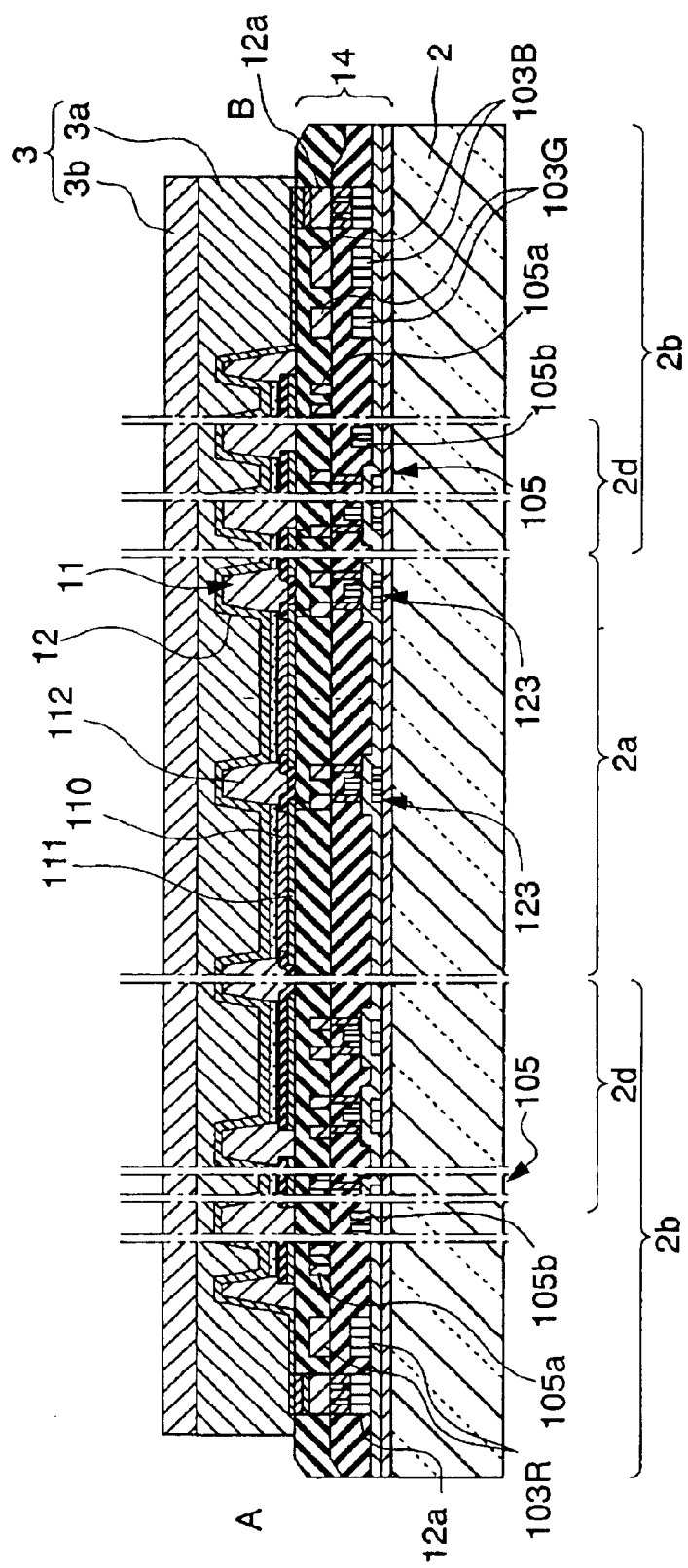
FIG. 26 is a cross section of a display device according to other embodiment of the present invention.

FIG. 26 is a cross section of a display device as another example according to the present invention. A display device shown in FIG. 26 comprises a base body 2, a display element 10 which is formed on the base body 2, a sealing resin 603 which is applied around the base body in circular manner, and a sealing section 3 which is provided on the display element 10.

The base body 2 and the display element 10 are the same as the base body 2 and the display element 10 according to the above first embodiment. The display element 10 comprises mainly an illuminating element section 11 and a cathode 12 which is formed on the illuminating element section 11.

Also, as shown in FIG. 26, a sealing section 3 is provided on the illuminating element section 11. The sealing section 3 is formed by a sealing resin made from a thermally-curable-resin or an ultraviolet-ray-curable resin applied on the cathode 12 and a sealing base board 3b which is disposed on the sealing resin 3a. Here, it is preferable to use the sealing resin 3a which does not generate a gas or solvent during a hardening period.

The sealing section 3 is formed so as to cover at least approximately the entire cathode 12 which is disposed on the illuminating element section 11. By doing this, the sealing section 3 prevents a water or an oxygen from invading a functional layer including the cathode 12 and the illuminating layer so as to prevent the cathode 12 and the illuminating layer from being oxidized.

Here, the sealing base board 3b is attached to the sealing resin 3a so as to protect the sealing resin 3a. It is preferable that the sealing base board 3b be a glass member or a metal member.

Also, FIG. 27 is a cross section of a display device as other example according to the present invention. The display device shown in FIG. 27 comprises a base body 2, a display element 10 which is formed on the base body 2, a sealing resin 3a which is applied on an entire surface of the display element 10, and a sealing base board 3b which is provided on the sealing resin 3a.

The base body 2, the display element 10, the sealing resin 3a, and a sealing base board 3b are the same as the base body 2, the display element 10, the sealing resin 3a, and a sealing base board 3b according to the first embodiment.

Also, as shown in FIG. 27, a protecting layer 714 is formed between the sealing member 3 and the cathode 12. The protecting layer 714 is made from $SiO_2$, SiN, or the like having thickness of 100 to 200 nm. The protecting layer 714 prevents water or oxygen from invading the cathode 12 and the functional layer including the illuminating layer; thus, the oxidization in the cathode 12 and the illuminating layer is prevented.

According to the above display device, the invasion of water and oxygen can be effectively prevented; thus, the oxidization in the cathode 12 or the illuminating layer can be prevented. By doing this, it is possible to realize higher brightness and longer product life in the display device.

Figure 28A:
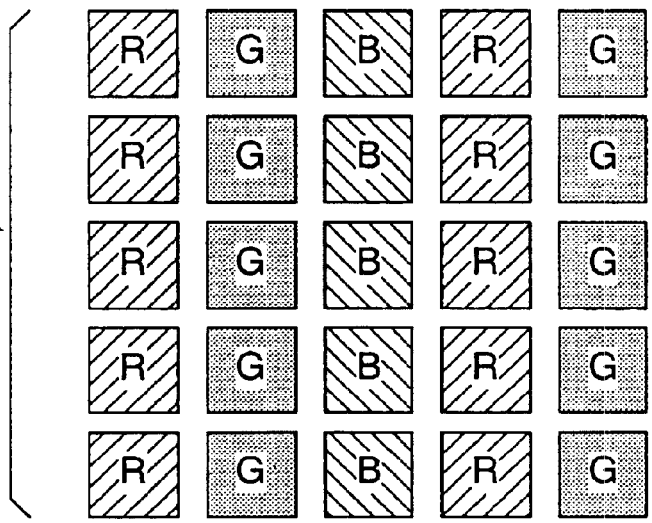
FIGS. 28A to 28C are plan views showing disposition of illuminating layers.
Figure 28B:
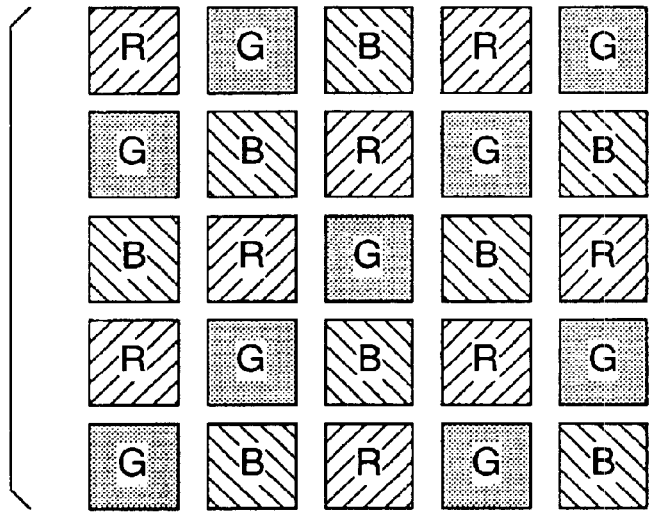
Figure 28C:
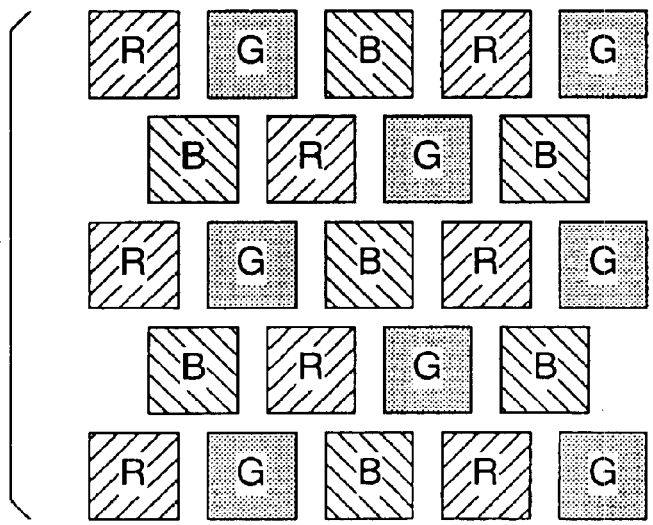

Also, in the first embodiment, a case in which illuminating layers 110b such as R, B, and G are disposed in a stripe is explained. However, the present invention is not limited to such a disposition. In the present invention, it is possible to adapt various disposition structures. For example, in addition to the stripe disposition shown in FIG. 28A, it is possible to adapt mosaic disposition shown in FIG. 28B or a delta disposition shown in FIG. 28C

INDUSTRIAL APPLICABILITY

As explained in detail above, according to manufacturing method for a display device in the present invention, a liquid drop of the above composition which is initially injected for each functional layer contacts at least a part of the above bank section. By doing this, the liquid drop is transported on the electrode surface from the bank section. Thus, it is possible to spread the liquid drop of the composition around the electrode preferentially; therefore, it is possible to apply the composition uniformly. By doing this, it is possible to form the functional layer in a uniform thickness.

What is claimed is:

1. Manufacturing method for a display device in which functional layers and electrodes are formed above a base body and bank sections are provided between the functional layers comprising:

forming the bank sections so as to overlap a part of the electrodes;

processing a part of the bank sections to be water-repellant;

forming at least a functional layer above each of the electrodes by injecting compositions from a plurality of nozzles;

wherein nozzle arrays where a plurality of the nozzles are disposed scan the base body in a diagonal manner in a main scanning direction, and wherein liquid drops of the compositions which are initially injected for each functional layer are injected so as to contact at least a part of the bank sections; and forming opposite electrodes above the functional layer.

2. Manufacturing method for a display device according to claim 1 wherein:

a region which is processed to be lyophilic and a region which is processed to be water-repellant are formed in the bank sections; and the liquid drops of the composition contacts the water-repellant region.

3. Manufacturing method for a display device according to claim 2 wherein:

the bank sections are formed by a first bank layer which is processed to be lyophilic and a second bank layer which is processed to be water-repellant; and the first bank layer is formed so as to overlap a part of the electrodes.

4. Manufacturing method for a display device in which functional layers are formed on each of a plurality of electrodes formed on a base body and bank sections are provided between the functional layers comprising steps of:

bank section forming step for forming the bank sections so as to overlap a part of the electrode:

lyophilizing step for processing at least a part of the electrodes to be lyophilic;

water-repelling step for processing a part of the bank sections to be water-repellant;

functional layer forming step for forming at least a functional layer on each of the electrodes by injecting compositions from a plurality of nozzles; and facing electrodes forming step for forming facing electrodes on the functional layer;

wherein, in the functional layer forming step, while nozzle arrays where a plurality of the nozzles are disposed scan on the base body in a diagonal manner in a main scanning direction, the liquid drops of the compositions which are initially injected for each functional layer are injected so as to contact at least a part of the bank sections.

5. Manufacturing method for a display device according to claim 4 wherein:

the bank sections are formed by a first bank layer which is processed to be lyophilic in the lyophilizing step and a second bank layer which is processed to be water-repellant in the water-repellant step; and the first bank layer is formed so as to overlap a part of the electrode.

6. Manufacturing method for a display device according to claim 1 wherein the functional layer includes at least a positive hole implantation/transportation layer.

7. Manufacturing method for a display device according to claim 1 wherein the functional layer includes at least an illuminating layer.

8. Manufacturing method for a display device according to claim 1 wherein, in the functional layer forming step, each of the functional layer is formed by injecting liquid drops of the composition by plural times, and an interval for dropping the liquid drops are larger than a diameter of the liquid drop.

9. Manufacturing method for a display device according to claim 1 wherein, in the functional layer forming step, each of the functional layer is formed by injecting liquid drops of the composition by plural times, and an interval for dropping the liquid drops are smaller than a diameter of the liquid drop.

10. Manufacturing method for a display device according to claim 9 wherein scanning operation by nozzle arrays for each of the functional layer is performed once.

11. Manufacturing method for a display device according to claim 8 wherein scanning operation by nozzle arrays for each of the functional layer is performed more than twice.

12. Manufacturing method for a display device according to claim 8 wherein a different nozzle is used for each scanning operation by the nozzle arrays for each of the functional layer.

13. Manufacturing method for a display device according to claim 12 wherein a different nozzle is used for each scanning operation by the nozzle arrays for each of the functional layer by shifting the nozzle arrays in a sub-scanning direction.

14. A display device manufactured in manufacturing method for a display device according to claim 1.

15. Manufacturing method of an electric apparatus having a display device and a driving circuit for driving the display device, the display device in which functional layers and electrodes are formed above a base body and bank sections are provided between the functional layers and the electric apparatus comprising:

forming the bank sections so as to overlap a part of the electrodes;

forming a region by processing a part of the bank sections to be water-repellant;

forming at least one functional layer above each of the electrodes by injecting compositions from a plurality of nozzles;

wherein nozzle arrays where a plurality of the nozzles are disposed scan the base body in a diagonal manner in a main scanning direction, and wherein liquid drops of the compositions which are initially injected for each functional layer are injected so as to contact at least a part of the bank sections, and forming opposite electrodes above the functional layer.

16. Manufacturing method for an electronic apparatus according to claim 15 further comprising:

a region which is processed to be lyophilic.

17. Manufacturing method for an electronic apparatus according to claim 16 wherein:

the bank sections are formed by a first bank layer which is processed to be lyophilic and a second bank layer which is processed to be water-repellant; and the first bank layer is formed so as to overlap a part of the electrode.

18. Manufacturing method for a display device in which functional layers are formed on each of a plurality of electrodes formed on a base body and bank sections are provided between the functional layers and an electronic apparatus having a driving circuit for driving the display device, comprising steps of:

bank section forming step for forming the bank sections so as to overlap a part of the electrode;

lyophilizing step for processing at least a part of the electrodes to be lyophilic;

water-repelling step for processing a part of the bank sections to be water-repellant;

functional layer forming step for forming at least a functional layer on each of the electrodes by injecting compositions from a plurality of nozzles; and facing electrodes forming step for forming facing electrodes on the functional layer;

wherein, in the functional layer forming step, while nozzle arrays where a plurality of the nozzles are disposed scan on the base body in a diagonal manner in a main scanning direction, the liquid drops of the compositions which are initially injected for each functional layer are injected so as to contact at least a part of the bank sections.

19. Manufacturing method for an electronic apparatus according to claim 14 wherein:

the bank sections are formed by a first bank layer which is processed to be lyophilic in the lyophilizing step and a second bank layer which is processed to be water-repellant in the water-repellant step; and the first bank layer is formed so as to overlap a part of the electrode.

20. Manufacturing method for an electronic apparatus according to claim 15 wherein the functional layer includes at least a positive hole implantation/transportation layer.

21. Manufacturing method for a display device according to claim 15 wherein the functional layer includes at least an illuminating layer.

22. Manufacturing method for a display device according to claim 15 wherein, in the functional layer forming step, each of the functional layer is formed by injecting liquid drops of the composition by plural times, and an interval for dropping the liquid drops are larger than a diameter of the liquid drop.

23. Manufacturing method for a display device according to claim 15 wherein, in the functional layer forming step, each of the functional layer is formed by injecting liquid drops of the composition by plural times, and an interval for dropping the liquid drops are smaller than a diameter of the liquid drop.

24. Manufacturing method for a display device according to claim 23 wherein scanning operation by nozzle arrays for each of the functional layer is performed once.

25. Manufacturing method for a display device according to claim 22 wherein scanning operation by nozzle arrays for each of the functional layer is performed more than twice.

26. Manufacturing method for a display device according to claim 22 wherein a different nozzle is used for each scanning operation by the nozzle arrays for each of the functional layer.

27. Manufacturing method for a display device according to claim 26 wherein a different nozzle is used for each scanning operation by the nozzle arrays for each of the functional layer by shifting the nozzle arrays in a sub-scanning direction.

28. An electronic apparatus manufactured in manufacturing method for an electronic apparatus according to claim 1.

29. Manufacturing method for a display device in which functional layers are formed on each of a plurality of electrodes formed on a base body and bank sections are provided between the functional layers comprising:

forming the bank sections so as to overlap a part of the electrodes;

processing a part of the bank sections to be water-repellant;

forming at least a functional layer above each of the electrodes by injecting compositions from a plurality of nozzles;

wherein nozzle arrays where a plurality of the nozzles are disposed scan the base body in a diagonal manner in a main scanning direction, and forming opposite electrodes above the functional layer.

30. Manufacturing method for a display device in which functional layers are formed on each of a plurality of electrodes formed on a base body and bank sections are provided between the functional layers comprising:

forming the bank sections so as to overlap a part of the electrodes;

forming at least a functional layer above each of the electrodes by the compositions from a plurality of nozzles;

wherein nozzle arrays where a plurality of the nozzles are disposed scan the base body in a diagonal manner in a main scanning direction, and wherein liquid drops of compositions which are initially injected for each functional layer are injected so as to contact at least a part of the bank sections, and forming opposite electrodes above the functional layer.

* * * * *